US012772664B2

(12) United States Patent
An et al.

(10) Patent No.: US 12,772,664 B2
(45) Date of Patent: Oct. 20, 2026

(54) DISPLAY DEVICE

(71) Applicant: Samsung Display Co., LTD., Yongin-si (KR)

(72) Inventors: Chi Wook An, Yongin-si (KR); Jung-Hyun Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 729 days.

(21) Appl. No.: 18/125,203

(22) Filed: Mar. 23, 2023

(65) Prior Publication Data

US 2023/0422558 A1 Dec. 28, 2023

(30) Foreign Application Priority Data

Jun. 27, 2022 (KR) ........................ 10-2022-0078493

(51) Int. Cl.

| | |
|---|---|
| ***H10K 59/122*** | (2023.01) |
| ***H10K 59/123*** | (2023.01) |
| ***H10K 59/40*** | (2023.01) |
| ***H10K 59/80*** | (2023.01) |
| ***H10K 102/00*** | (2023.01) |

(52) U.S. Cl.

CPC ......... *H10K 59/122* (2023.02); *H10K 59/123* (2023.02); *H10K 59/40* (2023.02); *H10K 59/873* (2023.02); *H10K 59/879* (2023.02); *H10K 2102/311* (2023.02)

(58) Field of Classification Search

None

See application file for complete search history.

(56) References Cited

U.S. PATENT DOCUMENTS 12,171,116 B2 * 12/2024 Kim ..................... H10K 59/122
2022/0140010 A1 5/2022 Lee
2022/0173177 A1 * 6/2022 Cho ................. H10K 59/80515

(Continued)

FOREIGN PATENT DOCUMENTS

CN 114823788 A * 7/2022 ............. H10K 59/12
CN 217522011 U * 9/2022 ........... H10K 50/125

(Continued)

OTHER PUBLICATIONS

European Search Report for European Application No. 23169559.4, dated Nov. 15, 2023.

*Primary Examiner* — Michael Lebentritt

(74) *Attorney, Agent, or Firm* — F. CHAU & ASSOCIATES, LLC

(57) ABSTRACT

An emissive display device includes: a substrate; a transistor disposed on the substrate; a first electrode electrically connected to the transistor; a pixel defining layer disposed on the first electrode and including a pixel opening overlapping the first electrode; an emission layer overlapping the first electrode and disposed in the pixel opening; a second electrode disposed on the pixel defining layer and the emission layer; an encapsulation layer disposed on the second electrode; a first organic layer disposed on the encapsulation layer and including a rotation opening; and a second organic layer disposed inside of the rotation opening and on the first organic layer. The rotation opening has a planar shape formed by increasing a planar shape of the pixel opening by a ratio and rotating the planar shape of the pixel opening by an angle in a direction.

19 Claims, 26 Drawing Sheets

(56) References Cited

U.S. PATENT DOCUMENTS

| | | | | |
|---|---|---|---|---|
| 2022/0190067 | A1 | 6/2022 | Byun et al. | |
| 2023/0108100 | A1* | 4/2023 | Park | H10D 86/60 257/40 |
| 2023/0209923 | A1* | 6/2023 | Park | H10K 59/1315 257/40 |
| 2023/0269990 | A1* | 8/2023 | Cho | H10K 39/34 |
| 2023/0345766 | A1* | 10/2023 | Lee | H10K 59/10 |
| 2024/0008338 | A1 | 1/2024 | Cho et al. | |
| 2024/0107814 | A1* | 3/2024 | You | H10K 59/122 |
| 2024/0138243 | A1* | 4/2024 | Lee | H10K 59/122 |

FOREIGN PATENT DOCUMENTS

| | | | | | |
|---|---|---|---|---|---|
| CN | 118475156 | A | * | 8/2024 | H10K 59/873 |
| CN | 119836176 | A | * | 4/2025 | H10K 59/40 |
| CN | 119923148 | A | * | 5/2025 | H10K 59/131 |
| EP | 3 806 158 | | | 4/2021 | |
| EP | 4301116 | A1 | * | 1/2024 | H10K 59/879 |
| JP | 2024141627 | A | * | 10/2024 | H10K 59/1201 |
| KR | 10-2021-0041675 | | | 4/2021 | |
| KR | 10-2022-0058716 | | | 5/2022 | |
| KR | 10-2022-0060607 | | | 5/2022 | |
| KR | 20220087619 | A | * | 6/2022 | H10K 59/8792 |
| KR | 102440114 | B1 | * | 9/2022 | H01L 51/0097 |
| KR | 20220147180 | A | * | 11/2022 | H01L 27/3276 |
| KR | 20230010109 | A | * | 1/2023 | H01L 27/3276 |
| KR | 10-2023-0164266 | | | 12/2023 | |
| KR | 102792336 | B1 | * | 4/2025 | H10K 59/124 |
| WO | WO-2021103504 | A1 | * | 6/2021 | G09G 3/3233 |
| WO | WO-2023098420 | A1 | * | 6/2023 | H10K 59/122 |

* cited by examiner

DISPLAY DEVICE

CROSS-REFERENCE TO RELATED APPLICATION(S)

This application claims priority to and benefits of Korean Patent Application No. 10-2022-0078493 under 35 U.S.C. § 119, filed on Jun. 27, 2022, in the Korean Intellectual Property Office, the entire contents of which are incorporated herein by reference.

BACKGROUND

1. Technical Field

Embodiments relate to a display device having improved transmittance in an element area.

2. Description of the Related Art

A display device is a device that displays a screen, and includes a liquid crystal display (LCD), an organic light emitting diode display (OLED), and the like. These display devices are used in various electronic devices such as portable phones, navigation devices, digital cameras, electronic books, portable game machines, or various terminals.

The above information disclosed in this Background section is only for enhancement of understanding of the background of the described technology, and therefore it may contain information that does not form the prior art that is already known in this country to a person of ordinary skill in the art.

SUMMARY

Embodiments provide a display device capable of improving luminance.

Embodiments provide a display device in which front luminance and/or transmittance is not deteriorated or changed even with a process error or a process distribution that is occurred in a process of forming an organic layer for improving transmittance.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment may include: a substrate; a transistor disposed on the substrate; a first electrode electrically connected to the transistor; a pixel defining layer disposed on the first electrode and including a pixel opening overlapping the first electrode; an emission layer overlapping the first electrode and disposed in the pixel opening; a second electrode disposed on the pixel defining layer and the emission layer; an encapsulation layer disposed on the second electrode; a first organic layer disposed on the encapsulation layer and including a rotation opening; and a second organic layer disposed inside of the rotation opening and on the first organic layer, wherein the rotation opening may have a planar shape formed by increasing a planar shape of the pixel opening by a ratio and rotating the planar shape of the pixel opening by an angle in a direction.

A virtual opening may be defined as a reference opening maximizing a front luminance ratio of the display device, and the virtual opening may be determined by increasing the planar shape of the pixel opening by the ratio.

A virtual opening is defined by increasing the planar shape of the pixel opening is increased by the ratio, and a horizontal distance on a plane between the virtual opening and the pixel opening may be greater than about 0 μm and less than or equal to about 2.0 μm.

A refractive index of the second organic layer may be greater than a refractive index of the first organic layer.

The rotation opening may include a first rotation opening formed by rotating the planar shape of the pixel opening by the angle in a counterclockwise direction and a second rotation opening formed by rotating the planar shape of the pixel opening by the angle in a clockwise direction.

The first rotation opening and the second rotation opening may be alternately disposed.

Each of the first rotation opening and the second rotation opening may be disposed to overlap a pixel opening corresponding to a red emission layer, a pixel opening corresponding to a green emission layer, and a pixel opening corresponding to a blue emission layer.

The angle, which is formed by an extension line of a side of the pixel opening and a side of the rotation opening, may be about 1.5 degrees or more and about 6 degrees or less.

A virtual opening may be defined by increasing the planar shape of the pixel opening by the ratio, a portion of the rotation opening disposed outside of the virtual opening may have a triangle shape, and a length of a shortest side of the triangle shape may be greater than about 0 μm and less than about 1.5 μm.

A difference between a minimum value and a maximum value among horizontal distances between a side of the pixel opening and a side of the rotation opening adjacent on a plane may be greater than about 0 μm and less than or equal to about 3 μm, and the horizontal distances between the side of the pixel opening and the side of the rotation opening adjacent on a plane may be distances in a direction perpendicular to the side of the pixel opening.

A display device according to an embodiment may include: a substrate; a transistor disposed on the substrate; a first electrode electrically connected to the transistor; a pixel defining layer disposed on the first electrode and including a pixel opening overlapping the first electrode; an emission layer overlapping the first electrode and disposed in the pixel opening; a second electrode disposed on the pixel defining layer and the emission layer; an encapsulation layer disposed on the second electrode; a first organic layer disposed on the encapsulation layer and including an opening including a protruding opening portion and a recessed opening portion; and a second organic layer disposed inside of the opening of the first organic layer.

A refractive index of the second organic layer may be greater than a refractive index of the first organic layer.

The opening of the first organic layer may include a protruding opening portion protruded outside of a virtual opening and a recessed opening portion disposed inside of the virtual opening, and the virtual opening may be defined as a reference opening maximizing a front luminance ratio.

The opening of the first organic layer may include a plurality of openings, the pixel opening of the pixel defining layer may include a plurality of pixel openings, at least two protruding opening portions of the plurality of openings of the first organic layer may be respectively spaced apart from sides of the plurality of pixel openings by a same distance on a plane, and at least two recessed opening portions of the plurality of openings of the first organic layer may be respectively spaced apart from the sides of the plurality of pixel openings by a same distance on a plane.

At least two of step differences formed by the at least two protruding opening portions and the at least two recessed opening portions in the opening of the first organic layer may have a same value.

The step difference between the at least two protruding opening portions and the at least two recessed opening portions on each side of the opening of the first organic layer may be greater than about 0 μm and less than or equal to about 3 μm.

The opening of the first organic layer may have a protruding opening portion and a recessed opening portion, and a width of the protruding opening portion and a width of the recessed opening portion may have a same value in the opening of the first organic layer.

The opening of the first organic layer may have a protruding opening portion and a recessed opening portion, and the recessed opening portion may be disposed on sides of the protruding opening portion on a side of the opening of the first organic layer.

The opening of the first organic layer may have a protruding opening portion and a recessed opening portion, and the protruding opening portion and the recessed opening portion may be formed in a same number on a side of the opening of the first organic layer.

The opening of the first organic layer may have a protruding opening portion and a recessed opening portion, and the protruding opening portion and the recessed opening portion may form a sawtooth shape.

According to embodiments, the display luminance at the front may be improved by allowing light to travel to the front through the opening formed in the first organic layer.

According to embodiments, the side of the opening formed in the first organic layer is changed gradually or symmetrically based on the point having maximum efficiency, and although a process error or a process dispersion occurs in manufacturing the opening of the first organic layer, front luminance and/or transmittance may not be deteriorated or changed.

DETAILED DESCRIPTION OF THE EMBODIMENTS

Figure 1:
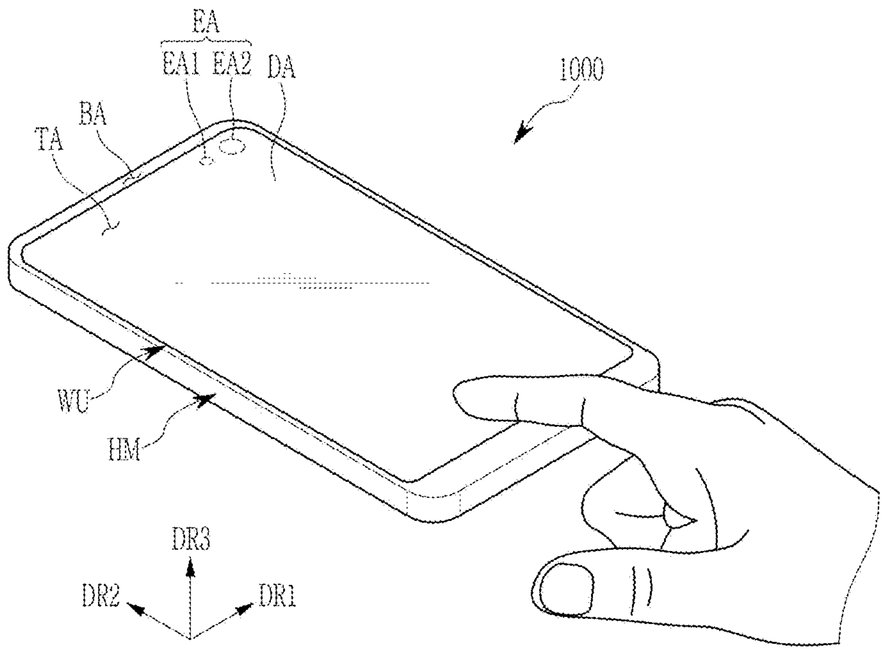
FIG. 1 is a schematic perspective view showing a use state of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

For example, electronic devices including display devices and display panels described in the specification (e.g., mobile phones, TV, monitors, laptop computers, etc.) or display devices and electronic devices including display panels, etc. manufactured by the manufacturing method described in the specification are not excluded from the right range of this specification.

Hereinafter, a structure of a schematic display device is described with reference to FIG. 1 to FIG. 3.

Figure 2:
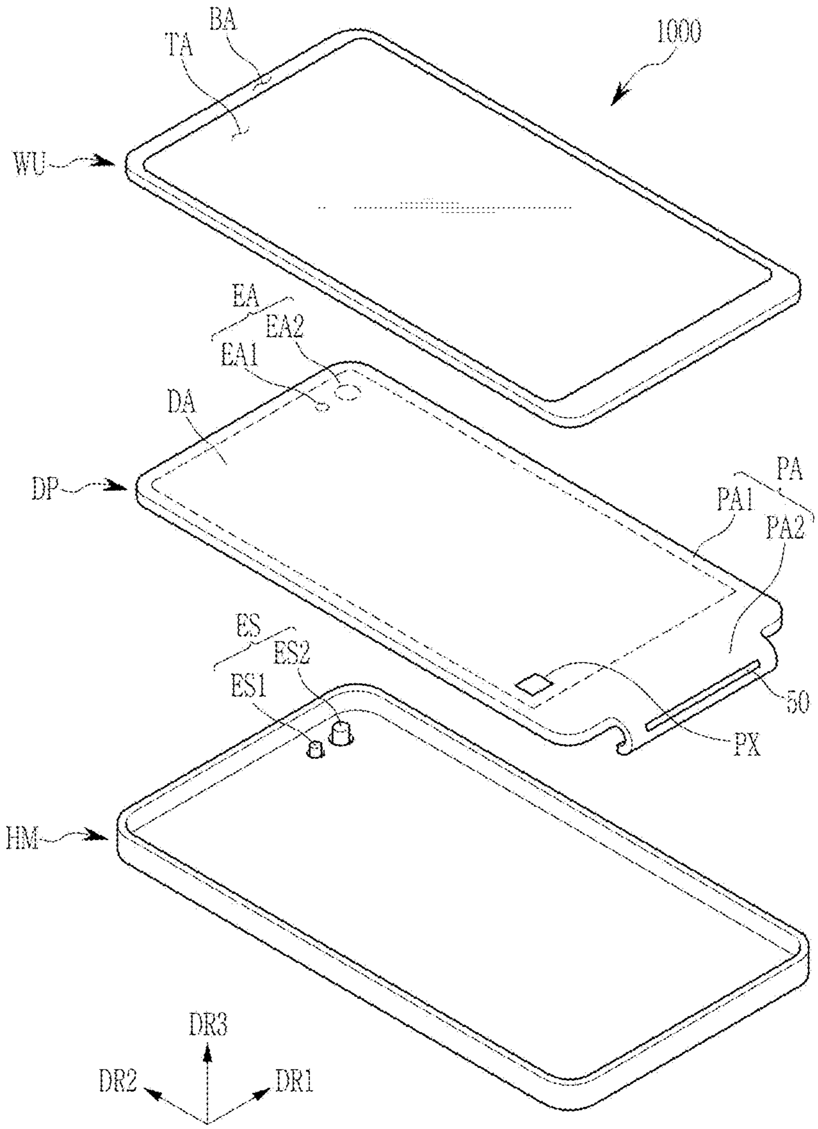
FIG. 2 is a schematic exploded perspective view of a display device according to an embodiment.
Figure 3:
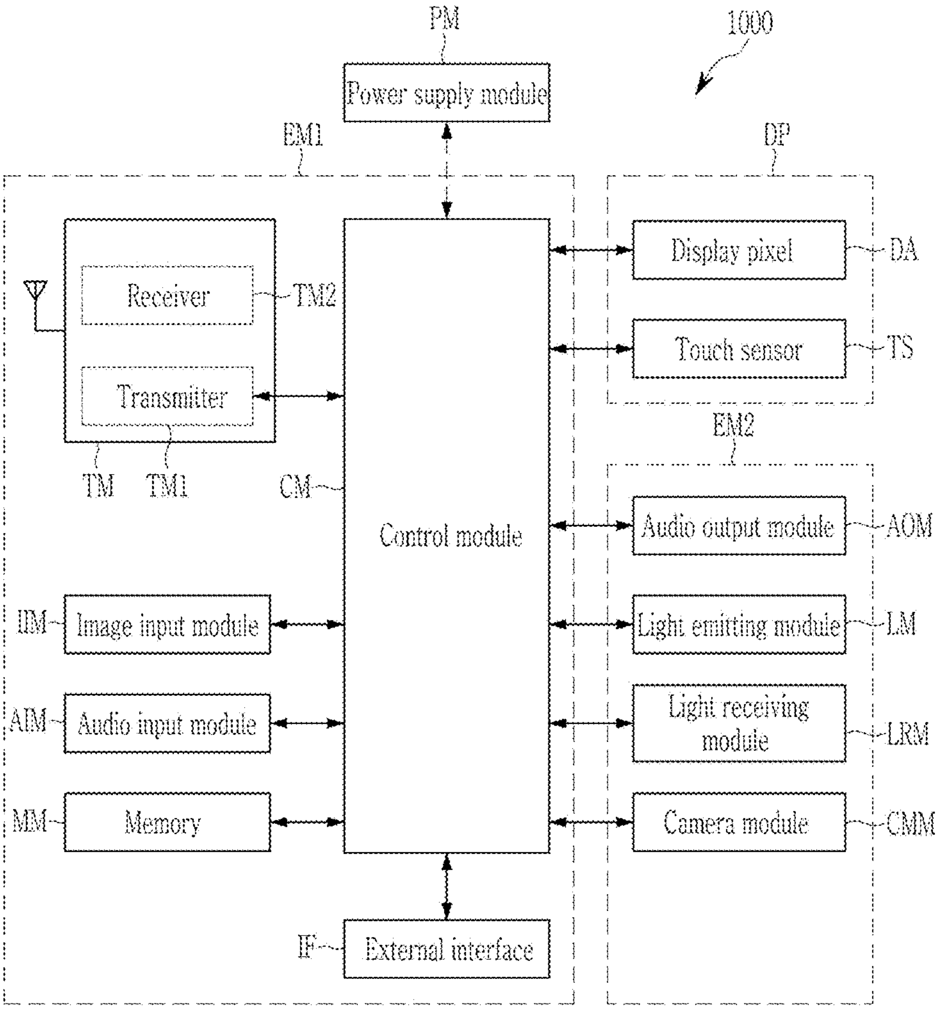
FIG. 3 is a schematic block diagram of a display device according to an embodiment.

FIG. 1 is a schematic perspective view showing a usage of a display device according to an embodiment, FIG. 2 is a schematic exploded perspective view of a display device according to an embodiment, and FIG. 3 is a schematic block diagram of a display device according to an embodiment.

Referring to FIG. 1, a display device 1000 according to an embodiment may be a device for displaying a motion picture or a still image, and may be used as a display screen of various products such as a television, a laptop, a monitor, an advertisement board, Internet of things (IOT), etc. as well as portable electronic devices such as a mobile phone, a smart phone, a tablet personal computer, a mobile communication terminal, an electronic notebook, an e-book, a PMP (portable multimedia player), a navigation device, a UMPC (Ultra Mobile PC), etc. For example, the display device 1000 according to an embodiment may be used in a wearable device such as a smart watch, a watch phone, a glasses display, and a head mounted display (HMD). For example, the display device 1000 according to an embodiment may be used as an instrument panel of a car, and a center fascia of the car or a CID (Center Information Display) disposed on a dashboard, a room mirror display that replaces a side mirror of the car, an entertainment device for a rear seat of the car, or a display disposed on the rear surface of the front seat. FIG. 1 shows that the display device 1000 is used as a smartphone for better comprehension and ease of description.

The display device 1000 may display an image in a third direction DR3 on a display surface parallel to each of a first direction DR1 and a second direction DR2. The display surface on which the image is displayed may correspond to the front surface of the display device 1000 and may correspond to the front surface of a cover window WU. The images may include static images as well as dynamic images.

In an embodiment, a front surface (or an upper surface) and a rear surface (or a lower surface) of each member are defined based on the direction in which the image is displayed. The front surface and the rear surface may be opposed to each other in the third direction DR3, and the normal directions of each of the front and the rear surfaces may be parallel to the third direction DR3. The separation distance in the third direction DR3 between the front surface and the rear surface may correspond to the thickness in the third direction DR3 of the display panel.

The display device 1000 according to an embodiment may detect an input (referring to a hand in FIG. 1) of a user applied from the outside. The input of the user may include various types of external inputs such as a part of the user's body, light, heat, or pressure. In an embodiment, the user's input is shown with the user's hand applied to the front. However, embodiments are not limited thereto. The user's input may be provided in various forms, and the display device 1000 may sense the user's input applied to the side surface or the rear surface of the display device 1000 according to the structure of the display device 1000.

Referring to FIG. 1 and FIG. 2, the display device 1000 may include a cover window WU, a housing HM, a display panel DP, and an optical element ES. In an embodiment, the cover window WU and the housing HM may be combined to form the appearance of the display device 1000.

The cover window WU may include an insulating panel. For example, the cover window WU may be formed of glass, plastic, or a combination thereof.

The front surface of the cover window WU may define the front surface of the display device 1000. The transmissive area TA may be an optically transparent area. For example, the transmissive area TA may be an area having visible ray transmittance of about 90% or more.

The blocking area BA may define the shape of the transmissive area TA. The blocking area BA may be adjacent to the transmissive area TA and may surround the transmissive area TA. The blocking area BA may be an area having relatively low light transmittance compared to the transmissive area TA. The blocking area BA may include an opaque material that blocks light. The blocking area BA may have a certain color. The blocking area BA may be defined by a bezel layer provided separately from the transparent substrate defining the transmissive area TA, or may be defined by an ink layer formed by inserting or coloring the ink layer in the transparent substrate.

The display panel DP may include a display panel DP displaying an image and a driving part 50. The display panel DP may include the front surface including a display area DA and a non-display area PA. The display area DA may be an area in which a pixel operates and emits light according to an electrical signal.

In an embodiment, the display area DA may be an area in which the image is displayed including the pixel, and may be an area in which an external input is sensed by simultaneously positioning a touch sensor on the upper side of the pixel in the third direction DR3.

The transmissive area TA of the cover window WU may at least partially overlap the display area DA of the display panel DP. For example, the transmissive area TA may overlap the front surface of the display area DA or may overlap at least a portion of the display area DA. Accordingly, the user may recognize the image through the transmissive area TA or provide the external input based on the image. However, embodiments are not limited thereto. For example, in the display area DA, an area in which the image is displayed and an area in which the external input is detected may be separated from each other.

The non-display area PA of the display panel DP may at least partially overlap the blocking area BA of the cover window WU. The non-display area PA may be an area covered by the blocking area BA. The non-display area PA may be adjacent to the display area DA and may surround the display area DA. The image may not be displayed in the non-display area PA, and a driving circuit or driving wiring for driving the display area DA may be disposed. The non-display area PA may include a first peripheral area PA1 positioned outside of the display area DA and a second peripheral area PA2 including a driving part 50, connection wiring, and a bending area. In the embodiment of FIG. 2, the first peripheral area PA1 may be positioned on three sides of the display area DA, and the second peripheral area PA2 may be positioned on the other side of the display area DA.

In an embodiment, the display panel DP may be assembled in a flat state in which the display area DA and the non-display area PA face the cover window WU. However, embodiments are not limited thereto. The part of the non-display area PA of the display panel DP may be bent. For example, the portion of the non-display area PA may face the rear surface of the display device 1000, so that the blocking area BA shown on the front surface of the display device 1000 may be reduced, and as shown in FIG. 2, the second peripheral area PA2 may be bent to be positioned on the rear surface of the display area DA, and assembled.

For example, the display panel DP may include a component area EA including a first component area EA1 and a second component area EA2. The first component area EA1 and the second component area EA2 may be at least partially surrounded by the display area DA. Although the first component area EA1 and the second component area EA2 are shown to be spaced apart from each other, embodiments are not limited thereto. For example, the first component area EA1 and the second component area EA2 may be connected To each other. The first component area EA1 and the second component area EA2 may be areas in which a component, which operates by using infrared rays, visible rays, or a sound, is disposed below the first component area EA1 and the second component area EA2.

The display area DA may include light emitting diodes (LEDs), and pixel circuit units for generating and transmitting a light emitting current to each of light emitting diodes (LEDs). For example, one light emitting element ED and one pixel circuit unit are referred to as a pixel PX. In the display area DA, one pixel circuit unit and one light emitting element ED may be formed one-to-one.

The first component area EA1 may include a transmissive part through which light or/and sound may pass and a display unit including pixels. The transmissive part may be positioned between the adjacent pixels and may be composed of a transparent layer through which light or/and sound may pass. The display unit may be formed to have one unit structure by adding pixels, and the transmissive part may be positioned between the adjacent unit structures. According to the embodiment, a layer that does not transmit light, such as a light blocking layer, may overlap the first component area EA1.

The second component area EA2 may include an area composed of a transparent layer transmitting light therethrough, a conductive layer or a semiconductor layer may not be positioned, and a pixel defining layer and a light blocking layer including a light blocking material including an opening overlapping the position corresponding to the second component area EA2, thereby having a structure that does not block light.

Referring to FIG. 3 in addition to FIG. 1 and FIG. 2, the display panel DP may include the display area DA including the display pixel and the touch sensor TS. The display panel DP may be visually recognized by the user from the outside through the transmissive area TA including the pixel that generates the image. For example, the touch sensor TS may be positioned on the pixel, and may detect the external input applied from the outside. The touch sensor TS may detect the external input provided to the cover window WU.

Again referring to FIG. 2, the second peripheral area PA2 may include a bending part. The display area DA and the first peripheral area PA1 may have a flat state substantially parallel to the plane defined by the first direction DR1 and the second direction DR2, and a side of the second peripheral area PA2 may extend in a flat state, may be bent to form a bending part, and may extend from the bending part in a flat state. At least a part of the second peripheral area PA2 may be bent and assembled to be positioned on the rear surface side of the display area DA. At least a portion of the second peripheral area PA2 may overlap the display area DA on a plane when being assembled, so that the blocking area BA of the display device 1000 may be reduced. However, embodiments are not limited thereto. For example, the second peripheral area PA2 may not be bent.

The driving part 50 may be mounted on the second peripheral area PA2, and may be mounted on the bending part or positioned on one of sides (e.g., opposite sides) of the bending part. The driving part 50 may have a form of a chip.

The driving part 50 may be mounted on the second peripheral area PA2, and may be mounted on the bending part or positioned on one of sides (e.g., opposite sides) of the bending part. For example, the driving part 50 may provide data signals to the pixels PX disposed in the display area DA. In another example, the driving part 50 may include a touch driving circuit and may be electrically connected to the touch sensor TS disposed in the display area DA. For example, the driving part 50 may be designed to include various circuits in addition to the above-described circuits or to provide various electrical signals to the display area DA.

For example, a pad part may be positioned at the end of the second peripheral area PA2, and the display device 1000 may be electrically connected to a flexible printed circuit board (FPCB) including a driving chip by the pad part. For example, the driving chip positioned on the flexible printed circuit board may include various driving circuits for driving the display device 1000 or connectors for power supply. According to an embodiment, instead of the flexible printed circuit board, a rigid printed circuit board (PCB) may be used.

The optical element ES may be disposed under the display panel DP. The optical element ES may include a first optical element ES1 overlapping the first component area EA1 and a second optical element ES2 overlapping the second component area EA2. The first optical element ES1 may use infrared rays. For example, the first component area EA1 may overlap a layer that does not transmit light, such as a light blocking layer.

The first optical element ES1 may be an electronic element, which operates by using light or sound. For example, the first optical element ES1 may be a sensor that receives and uses light such as an infrared sensor, a sensor that outputs and senses light or sound to measure a distance or recognize a fingerprint, a small lamp that outputs light, or a speaker that outputs a sound, etc. In case that the electronic element uses light, light of various wavelength bands such as visible light, infrared light, and ultraviolet light may be used.

The second optical element ES2 may be at least one of a camera, an infrared camera (IR camera), a dot projector, an infrared illuminator, and a time-of-flight sensor (ToF sensor).

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, the display pixel and the touch sensor TS positioned in the display area DA among the configurations of the display panel DP are shown as an example.

The power supply module PM may supply power required for the overall operation of the display device 1000. The power supply module PM may include a conventional battery module.

The first electronic module EM1 and the second electronic module EM2 may include various functional modules for operating the display device 1000. The first electronic module EM1 may be mounted (e.g., directly mounted) on the motherboard electrically connected to the display panel DP, or mounted on a separate substrate and electrically connected to the motherboard through a connector.

The first electronic module EM1 may include a control module CM, a wireless communication module TM, an image input module IIM, an audio input module AIM, a memory MM, and an external interface IF. Some of the modules are not mounted on the motherboard and may be electrically connected to the motherboard through a flexible printed circuit board connected thereto.

The control module CM may control the overall operation of the display device 1000. The control module CM may be a microprocessor. For example, the control module CM activates or deactivates the display panel DP. The control module CM may control other modules such as the image input module IIM or the audio input module AIM based on the touch signal received from the display panel DP.

The wireless communication module TM can transmit/receive a wireless signal with other terminals using Bluetooth or Wi-Fi. The wireless communication module TM may transmit/receive voice signals by using a general communication line. The wireless communication module TM may include a transmitter TM1 that modulates and transmits a signal to be transmitted, and a receiver TM2 that demodulates a received signal.

The image input module IIM may process the image signal to be converted into image data that is displayed on the display panel DP. The audio input module AIM may receive an external sound signal by a microphone in a recording mode, a voice recognition mode, etc. to be converted into electrical voice data.

The external interface IF may function as an interface connected to an external charger, a wired/wireless data port, or a card socket (e.g., a memory card, a SIM/UIM card).

The second electronic module EM2 may include an audio output module AOM, a light emitting module LM, a light receiving module LRM, and a camera module CMM, and at least some of these as the optical elements ES, as shown in FIG. 1 and FIG. 2, may be positioned on the rear surface of the display panel DP. The optical element ES may include a light emitting module LM, a light receiving module LRM, and a camera module CMM. For example, the second electronic module EM2 may be mounted (e.g., directly mounted) on the motherboard, or mounted on a separate substrate and electrically connected to the display panel DP through a connector, or electrically connected to the first electronic module EM1.

The audio output module AOM may convert audio data received from the wireless communication module TM or audio data stored in the memory MM to be output to the outside.

The light emitting module LM may generate and output light. The light emitting module LM may output infrared light. For example, the light emitting module LM may include an LED element. For example, the light receiving module LRM may detect (or sense) infrared light. The light receiving module LRM may be activated in case that infrared light above a certain level is detected. The light receiving module LRM may include a CMOS (complementary metal oxide semiconductor) sensor. After the infrared light generated by the light emitting module LM is output, the light may be reflected by an external subject (e.g., a user's finger or a face), and the reflected infrared light may be incident on the light receiving module LRM. The camera module CMM may take external images.

In an embodiment, the optical element ES may additionally include an optical detecting sensor or a thermal detecting sensor. The optical element ES may detect an external object received through the front surface or may provide a sound signal such as a voice through the front surface to the outside. For example, the optical element ES may include configurations, and is not limited to any one embodiment.

Referring to FIG. 2, the housing HM may be combined with the cover window WU. The cover window WU may be disposed in front of the housing HM. The housing HM may be combined with the cover window WU to provide an accommodation space. The display panel DP and the optical element ES may be accommodated in the accommodation space provided between the housing HM and the cover window WU.

The housing HM may include a material having relatively high stiffness. For example, the housing HM may include frames and/or plates formed of glass, plastic, or metal, or a combination thereof. The housing HM may reliably protect the components of the light emitting display device 1000 housed in the interior space from external impact.

Figure 4:
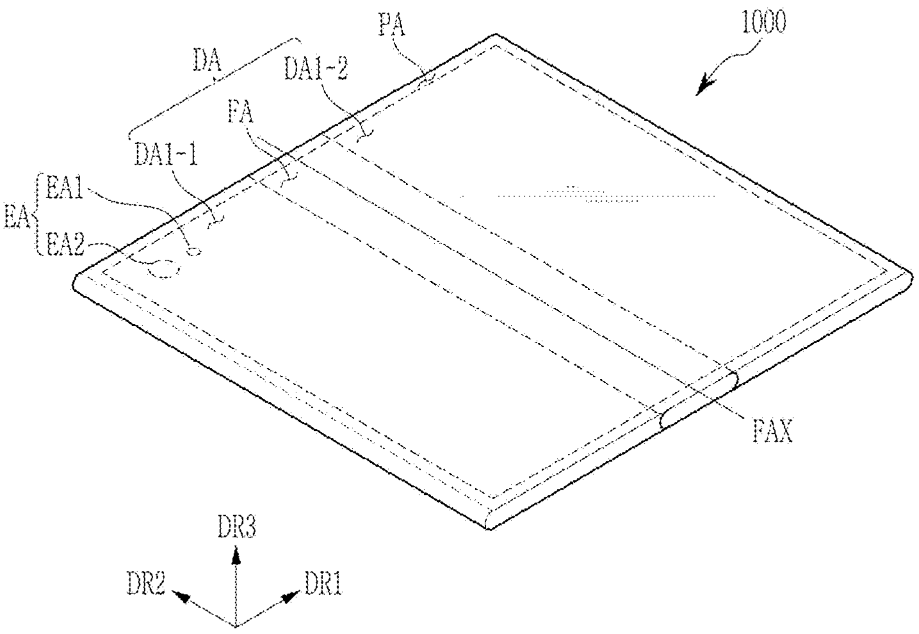
FIG. 4 is a schematic perspective view schematically showing a display device according to an embodiment.

Hereinafter, the structure of the display device 1000 according to an embodiment is described through FIG. 4. FIG. 4 is a schematic perspective view schematically showing a display device according to another an embodiment. The description of the same configuration as the above-described constituent elements is omitted for descriptive convenience.

The embodiment of FIG. 4 shows a foldable display device having a structure in which the display device 1000 is folded through a folding axis FAX.

Referring to FIG. 4, in an embodiment, the display device 1000 may be a foldable display device. The light emitting display device 1000 may be folded outward or inward based on the folding axis FAX. In case that the display device 1000 is folded outward based on the folding axis FAX, the display surfaces of the light emitting display device 1000 may be respectively positioned on the outside in the third direction DR3, so that the images may be displayed in directions (e.g., opposite directions). In case that the display device 1000 is folded inward based on the folding axis FAX, the display surface may not be visually recognized from the outside.

In an embodiment, the display device 1000 may include a display area DA, a component area EA, and a non-display area PA. The display area DA may be divided into a first-first display area DA1-1, a first-second display area DA1-2, and a folding area FA. The first-first display area DA1-1 and the first-second display area DA1-2 may be positioned on the left and right sides, respectively, based on (or at the center) of the folding axis FAX, and the folding area FA may be positioned between the first-first display area DA1-1 and the first-second display area DA1-2. In case that the display device 1000 is folded outward based on the folding axis FAX, the first-first display area DA1-1 and the first-second display area DA1-2 may be positioned on sides (e.g., opposite sides) in the third direction DR3, and the images may be displayed in directions (e.g., opposite directions). In case that the display device 1000 is folded inward based on the folding axis FAX, the first-first display area DA1-1 and the first-second display area DA1-2 may not be visually recognized from the outside.

Hereinafter, the structure of the display panel DP is described, and first, the structure of the display panel DP is described in detail with reference to FIG. 5.

Figure 5:
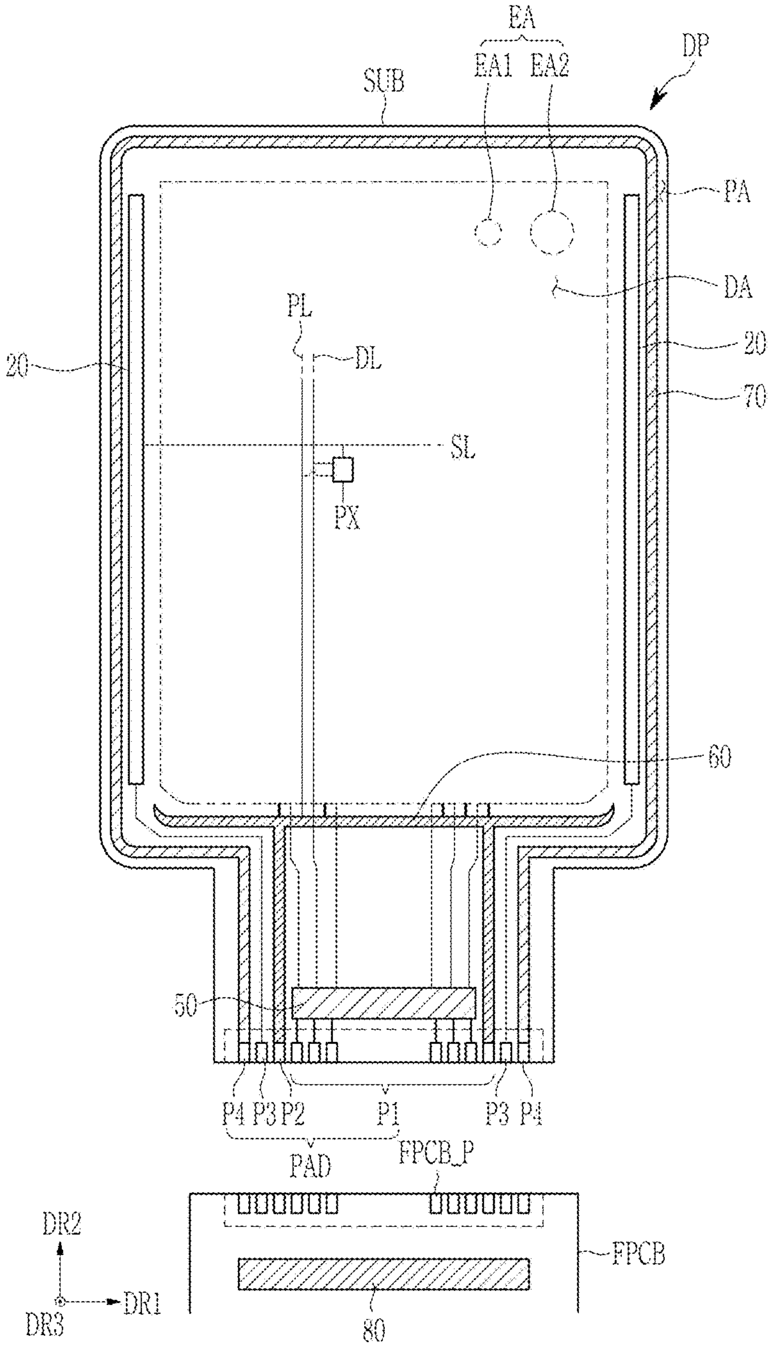
FIG. 5 is a schematic top plan view showing some constituent elements of a display panel according to an embodiment.

FIG. 5 is a schematic top plan view showing some constituent elements of the display panel according to an embodiment.

Referring to FIG. 5, the display panel DP may include the display area DA, the component area EA, and the non-display area PA, and the non-display area PA may be defined along the border of display area DA.

The display panel DP may include pixels PX. Pixels PX may be disposed in the display area DA. Each pixel PX may include a light emitting element and a pixel circuit connected thereto. Each pixel PX may emit light of, for example, red, green, and blue, or white, and may include, for example, an organic light emitting element (e.g., an organic light emitting diode).

The display panel DP may include signal lines and a pad part. Signal lines may include a scan line SL extending in a first direction DR1, and a data line DL and a driving voltage line PL and the like extending in a second direction DR2.

The scan driver 20 may be positioned on the left side and right side of the display area DA, and may generate and transmit a scan signal to each pixel PX through the scan line SL. The pixel PX may receive scan signals from two scan drivers 20 positioned on the left and right sides together.

A pad part (PAD; hereinafter referred to as a pad part for a circuit board) may be disposed to one end of the non-display area PA of the display panel DP, and may include terminals P1, P2, P3, and P4. The pad part PAD may be exposed without being covered by the insulating layer and may be electrically connected to the flexible printed circuit board FPCB. The pad part PAD may be electrically connected to a pad part FPCB_P of the flexible printed circuit board FPCB. The flexible printed circuit board FPCB may transmit the signal or power of the IC driving chip 80 to the pad part PAD.

The IC driving chip 80 may convert image signals transmitted from the outside into image data signals, and may transmit the changed signals to the driving part 50 through the terminal P1. For example, the IC driving chip 80 may receive a vertical synchronization signal, a horizontal synchronizing signal, and a clock signal, may generate a control signal to control the driving of the scan driver 20 and the driving part 50, and may transmit the control signal to each through the terminals P3 and P1. The IC driving chip 80 may transmit a driving voltage ELVDD to a driving voltage supply wiring 60 through the terminal P2. For example, the IC driving chip 80 may transmit a common voltage ELVSS to each of the common voltage supply wiring 70 through the terminal P4.

The driving part 50 may be disposed on the non-display area PA, may generate a data voltage DATA to be applied to each pixel PX, and may transmit the data voltage DATA to each data line DL. The driving part 50 may be disposed on a side of the display panel DP, and may be disposed between the pad part PAD and the display area DA. Referring to FIG. 5, the data line DL connected to the remaining pixels PX except for the pixel PX positioned above and below the component area EA along the second direction DR2 may extend along the second direction DR2 and may have a straight line structure. For example, the data line DL connected to the pixel PX positioned above and below the component area EA may extend along the second direction DR2, but may include a portion extending along the periphery of the component area EA on the periphery of the component area EA.

The driving voltage supply wiring 60 may be disposed on the non-display area PA. For example, the driving voltage supply wiring 60 may be disposed between the driving part 50 and the display area DA. The driving voltage supply wiring 60 may provide the driving voltage ELVDD to the pixels PX. The driving voltage supply wiring 60 may be disposed in the first direction DR1 and may be connected to driving voltage lines PL disposed in the second direction DR2.

The common voltage supply wiring 70 may be disposed on the non-display area PA. The common voltage supply wiring 70 may have a shape surrounding the substrate SUB. The common voltage supply wiring 70 may transmit the common voltage ELVSS to an electrode (e.g., a cathode) of the light emitting element included in the pixel PX.

An example of the circuit structure of the pixel PX positioned on the display panel DP as described above is described with reference to FIG. 6.

Figure 6:
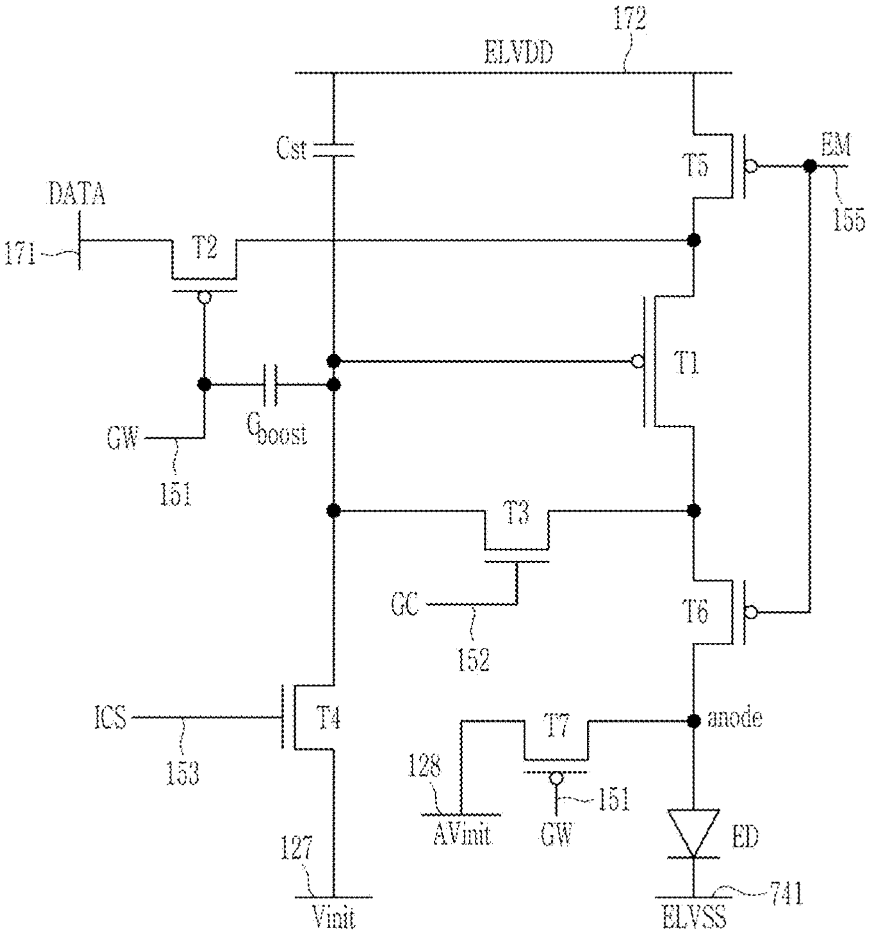
FIG. 6 is a schematic diagram of an equivalent circuit of a pixel included in a display panel according to an embodiment.

FIG. 6 is a schematic diagram of an equivalent circuit of a pixel included in a display panel according to an embodiment.

The circuit structure shown in FIG. 6 may be a circuit structure of a pixel circuit unit and a light emitting element formed in a part of the display area DA and the component area EA.

One pixel according to an embodiment may include transistors T1, T2, T3, T4, T5, T6, and T7, a storage capacitor Cst, a boost capacitor Cboost, and a light emitting element ED, which are connected to several wirings 127, 128, 151, 152, 153, 155, 171, 172, and 741. For example, the transistors and the capacitors except for the light emitting element ED may form a pixel circuit unit. In another example, the boost capacitor Cboost may be omitted.

Figure 7:
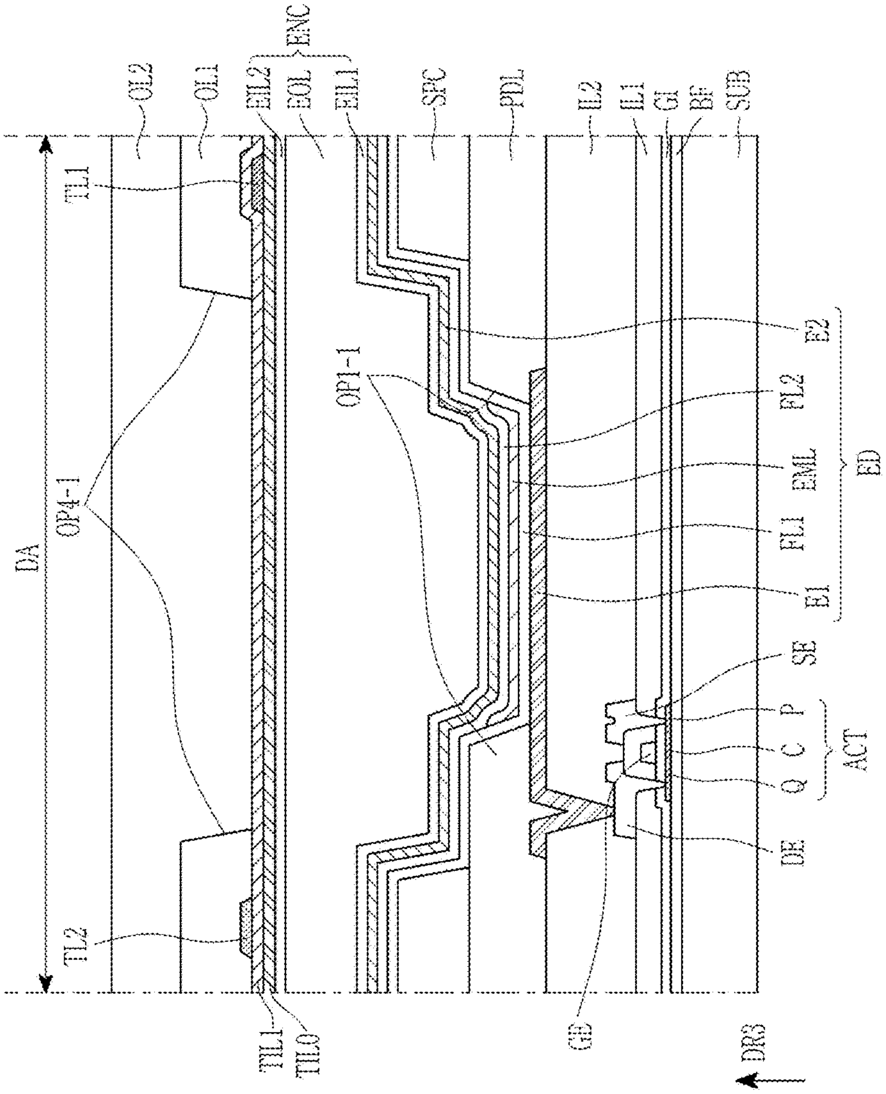
FIG. 7 is a schematic cross-sectional view of configurations disposed in a display area according to an embodiment.

Wirings 127, 128, 151, 152, 153, 155, 171, 172, and 741 may be connected to one pixel PX. Wirings may include a first initialization voltage line 127, a second initialization voltage line 128, a first scan line 151, a second scan line 152, an initialization control line 153, a light emission control line 155, a data line 171, a driving voltage line 172, and a common voltage line 741. In the embodiment of FIG. 7, the first scan line 151 connected to the seventh transistor T7 may be connected to the second transistor T2, however according to an embodiment, unlike the second transistor T2, the seventh transistor T7 may be connected with a separate bypass control line.

The first scan line 151 may be connected to a scan driver and may transmit the first scan signal GW to the second transistor T2 and the seventh transistor T7. A voltage of an opposite polarity to the voltage applied to the first scan line 151 may be applied to the second scan line 152 at the same timing as the signal of the first scan line 151. For example, in case that a negative voltage is applied to the first scan line 151, a positive voltage may be applied to the second scan line 152. The second scan line 152 may transmit a second scan signal GC to the third transistor T3. The initialization control line 153 may transmit an initialization control signal ICS to the fourth transistor T4. The light emission control line 155 may transmit a light emission control signal EM to the fifth transistor T5 and the sixth transistor T6.

The data line 171 may be a wire that transmits a data voltage DATA generated by a data driver, and the magnitude of the light emitting current transmitted to the light emitting element ED may change. Thus, the luminance of the light emitting element ED may change. The driving voltage line 172 may apply a driving voltage ELVDD. The first initialization voltage line 127 may transmit a first initialization voltage Vinit, and the second initialization voltage line 128 may transmit a second initialization voltage Avinit. The common voltage line 741 may apply a common voltage ELVSS to the cathode of the light emitting element ED. In an embodiment, the voltages applied to the driving voltage line 172, the first and second initialization voltage lines 127 and 128, and the common voltage line 741 may be constant voltages, respectively.

The driving transistor (T1; as called a first transistor) may be a p-type transistor and may have a silicon semiconductor (a polycrystalline semiconductor) as a semiconductor layer. The driving transistor may be a transistor that adjusts the magnitude of the light emitting current output to the anode of the light emitting element ED according to the magnitude of the voltage of the gate electrode of the driving transistor T1 (e.g., the voltage stored in the storage capacitor Cst). Since the brightness of the light emitting element ED is adjusted according to the magnitude of the light emitting current output to the anode of the light emitting element ED, the light emitting luminance of the light emitting element ED may be adjusted according to the data voltage DATA applied to the pixel. For example, the first electrode of the driving transistor T1 may be disposed to receive the driving voltage ELVDD and may be connected to the driving voltage line 172 via the fifth transistor T5. For example, the first electrode of the driving transistor T1 may be connected to the second electrode of the second transistor T2 to receive the data voltage DATA. For example, the second electrode of the driving transistor T1 may output the light emitting current to the light emitting element ED and may be connected to the anode of the light emitting element ED via the sixth transistor (T6; hereinafter referred to as an output control transistor). For example, the second electrode of the driving transistor T1 may be connected to the third transistor T3 and may transmit the data voltage DATA applied to the first electrode to the third transistor T3. For example, the gate electrode of the driving transistor T1 may be connected to an electrode (hereinafter, referred to as 'a second storage electrode') of the storage capacitor Cst. Accordingly, the voltage of the gate electrode of the driving transistor T1 may change according to the voltage stored in the storage capacitor Cst, and the light emitting current output by the driving transistor T1 may be changed. The storage capacitor Cst may function to keep the voltage of the gate electrode of the driving transistor T1 constant for one frame. For example, the gate electrode of the driving transistor T1 may be connected to the third transistor T3 so that the data voltage DATA applied to the first electrode of the driving transistor T1 may be transmitted to the gate electrode of the driving transistor T1 through the third transistor T3. For example, the gate electrode of the driving transistor T1 may be connected to the fourth transistor T4 and may be initialized by receiving the first initialization voltage Vinit.

The second transistor T2 may be a p-type transistor and may have a silicon semiconductor as a semiconductor layer. The second transistor T2 may be a transistor that receives the data voltage DATA into the pixel. The gate electrode of the second transistor T2 may be connected to the first scan line 151 and an electrode (hereinafter, referred to as 'a lower boost electrode') of the boost capacitor Cboost. The first electrode of the second transistor T2 may be connected to the data line 171. The second electrode of the second transistor T2 may be connected to the first electrode of the driving transistor T1. In case that the second transistor T2 may be turned on by a negative voltage among the first scan signals GW transmitted through the first scan line 151, the data voltage DATA transferred through the data line 171 may be transferred to the first electrode of the driving transistor T1, and the data voltage DATA may be transferred to the gate electrode of the driving transistor T1 and stored in the storage capacitor Cst.

The third transistor T3 may be an n-type transistor and may have an oxide semiconductor as a semiconductor layer. The third transistor T3 may electrically connect the second electrode of the driving transistor T1 and the gate electrode of the driving transistor T1. As a result, the third transistor T3 may be a transistor that compensates the data voltage DATA by the threshold voltage of the driving transistor T1 and stored in the second storage electrode of the storage capacitor Cst. The gate electrode of the third transistor T3 may be connected to the second scan line 152, and the first electrode of the third transistor T3 may be connected to the second electrode of the driving transistor T1. The second electrode of the third transistor T3 may be connected to the second storage electrode of the storage capacitor Cst, the gate electrode of the driving transistor T1, and the other electrode (hereinafter referred to as 'an upper boost electrode') of the boost capacitor Cboost. The third transistor T3 may be turned on by the positive voltage among the second scan signals GC received through the second scan line 152, thereby the gate electrode of the driving transistor T1 and the second electrode of the driving transistor T1 may be connected, and the voltage applied to the gate electrode of the driving transistor T1 may be transferred to the second storage electrode of the storage capacitor Cst and stored in the storage capacitor Cst. For example, the voltage stored in the storage capacitor Cst may be stored in a state in which the voltage of the gate electrode of the driving transistor T1 is stored in case that the driving transistor T1 is turned off. Thus, the threshold voltage Vth of the driving transistor T1 may be compensated.

The fourth transistor T4 may be an n-type transistor and may have an oxide semiconductor as a semiconductor layer. The fourth transistor T4 may function to initialize the gate electrode of the driving transistor T1 and the second storage electrode of the storage capacitor Cst. The gate electrode of the fourth transistor T4 may be connected to the initialization control line 153, and the first electrode of the fourth transistor T4 may be connected to the first initialization voltage line 127. The second electrode of the fourth transistor T4 may be connected to the second electrode of the third transistor T3, the second storage electrode of the storage capacitor Cst, the gate electrode of the driving transistor T1, and the upper boost electrode of the boost capacitor Cboost. The fourth transistor T4 may be turned on by the positive voltage of the initialization control signal ICS received through the initialization control line 153. For example, the first initialization voltage Vinit may be transmitted to the gate electrode of the driving transistor T1, the second storage electrode of the storage capacitor Cst, and the upper boost electrode of the boost capacitor Cboost to be initialized.

The fifth transistor T5 and the sixth transistor T6 may be p-type transistors and have a silicon semiconductor as a semiconductor layer.

The fifth transistor T5 may function to transfer a driving voltage (ELVDD) to the driving transistor T1. The gate electrode of the fifth transistor T5 may be connected to the light emission control line 155, the first electrode of the fifth transistor T5 may be connected to the driving voltage line 172, and the second electrode of the fifth transistor T5 may be connected to the first electrode of the driving transistor T1.

The sixth transistor T6 may function to transmit the light emitting current output from the driving transistor T1 to the light emitting element ED. The gate electrode of the sixth transistor T6 may be connected to the light emission control line 155, the first electrode of the sixth transistor T6 may be connected to the second electrode of the driving transistor T1, and the second electrode of the sixth transistor T6 may be connected to the anode of the light emitting diode LED.

The seventh transistor T7 may be an n-type transistor and may have a silicon semiconductor or an oxide semiconductor as a semiconductor layer. The seventh transistor T7 may function to initialize the anode of the light emitting diode LED. The gate electrode of the seventh transistor T7 may be connected to the bypass control line 154, the first electrode of the seventh transistor T7 may be connected to the anode of the light emitting diode LED, and the second electrode of the seventh transistor T7 may be connected to the second initialization voltage line 128. In case that the seventh transistor T7 may be turned on by the positive voltage among the bypass control signals GB transferred through the bypass control line 154, the second initialization voltage Avinit may be applied to the anode of the light emitting diode LED and may be initialized. For example, the gate electrode of the seventh transistor T7 may be connected to a separate bypass control line and may be controlled by separate wiring from the first scan line 151. According to an embodiment, the second initialization voltage line 128 to which the second initialization voltage Avinit is applied may be the same as the first initialization voltage line 127 to which the first initialization voltage Vinit is applied.

Although it has been described that one pixel PX includes seven transistors T1 to T7 and two capacitors (e.g., the storage capacitor Cst and the boost capacitor Cboost), embodiments are not limited thereto, and the boost capacitor Cboost may be excluded according to an embodiment. For example, although the third transistor T3, the fourth transistor T4, and the seventh transistor T7 may be n-type transistors in an embodiment, only one of them may be formed as an n-type transistor or the other transistors may be formed as n-type transistors. As an embodiment, all of the seven transistors may be changed to p-type transistors or n-type transistors.

Hereinafter, the stacked structure of the display area DA may be described with reference to FIG. 7

FIG. 7 is a schematic cross-sectional view of configurations disposed in a display area according to an embodiment.

The display panel according to an embodiment may include a substrate SUB. The substrate SUB may include an inorganic insulating material such as glass or an organic insulating material such as plastic such as a polyimide (PI). The substrate SUB may be single-layered or multi-layered. The substrate SUB may have a structure in which at least one base layer including a polymer resin and at least one inorganic layer are alternately stacked.

The substrate SUB may have flexibility of various degrees. The substrate SUB may be a rigid substrate or a flexible substrate capable of bending, folding, rolling, etc.

A buffer layer BF may be positioned on the substrate SUB. The buffer layer BF may block impurities from being transferred from the substrate SUB to the upper layer of the buffer layer BF, e.g., the semiconductor layer ACT, thereby preventing characteristic degradation of the semiconductor layer ACT and reducing stress. The buffer layer BF may include an inorganic insulating material such as a silicon nitride or a silicon oxide, or an organic insulating material. In another example, some or all of the buffer layer BF may be omitted.

The semiconductor layer ACT may be positioned on the buffer layer BF. The semiconductor layer ACT may include at least one of polysilicon and an oxide semiconductor. The semiconductor layer ACT may include a channel area C, a first area P, and a second area Q. The first area P and the second area Q may be disposed on sides (e.g., opposite sides) of the channel area C, respectively. The channel area C may include a semiconductor with a small amount of impurity doped compared to the first area P and the second area Q, or without being doped with an impurity (e.g., dopant), and the first area P and the second area Q may include a semiconductor doped with a large amount of the impurity (e.g., dopant) compared to the channel area C. The semiconductor layer ACT may be formed of an oxide semiconductor, and in this case, a separate protective layer may be added to protect the oxide semiconductor material that is vulnerable to external environments such as a high temperature.

A gate insulating layer GI may be positioned on the semiconductor layer ACT. The gate insulating layer GI may be a single layer or a multilayer including at least one among a silicon oxide ($SiO_x$), a silicon nitride ($SiN_x$), and a silicon oxynitride ($SiO_xN_y$).

A gate electrode GE may be positioned on the gate insulating layer GI. The gate electrode GE may be a single layer or multilayer in which a metal film including any one of copper (Cu), a copper alloy, aluminum (Al), an aluminum alloy, molybdenum (Mo), a molybdenum alloy, titanium (Ti), and a titanium alloy may be stacked. The gate electrode GE may overlap the channel area C of the semiconductor layer ACT.

A first insulating layer IL1 may be positioned on the gate electrode GE and the gate insulating layer GI. The first insulating layer IL1 may be a single layer or a multilayer including at least one of a silicon oxide ($SiO_x$), a silicon nitride ($SiN_x$), and a silicon oxynitride ($SiO_xN_y$).

A source electrode SE and a drain electrode DE may be positioned on the first insulating layer IL1. The source electrode SE and the drain electrode DE may be respectively connected to the first area P and the second area Q of the semiconductor layer ACT through contact holes formed in the first insulating layer IL1.

The source electrode SE and the drain electrode DE may include aluminum (Al), silver (Ag), magnesium (Mg), gold (Au), nickel (Ni), chromium (Cr), nickel (Ni), calcium (Ca), molybdenum (Mo), titanium (Ti), tungsten (W), and/or copper (Cu), and may have a single layer or multilayer structure including the same material.

A second insulating layer IL2 may be positioned on the first insulating layer IL1, the source electrode SE, and the drain electrode DE. The second insulating layer IL2 may include an organic insulating material such as a general purpose polymer such as poly(methyl methacrylate) (PMMA) or polystyrene (PS), a polymer derivative having a phenolic group, an acryl-based polymer, an imide-based polymer, a polyimide, an acryl-based polymer, and a siloxane-based polymer. Although this specification shows the second insulating layer IL2 formed as a single layer, embodiments are not limited thereto. For example, the second insulating layer IL2 may be formed as a multilayer.

A first electrode E1 may be positioned on the second insulating layer IL2. The first electrode E1 may be electrically connected to the drain electrode DE through the contact hole of the second insulating layer IL2.

The first electrode E1 may include metals such as silver (Ag), lithium (Li), calcium (Ca), aluminum (Al), magnesium (Mg), and gold (Au), and may include a transparent conductive oxide (TCO) such as an indium tin oxide (ITO) and an indium zinc oxide (IZO). The first electrode E1 may be formed of a single layer including a metal material or a transparent conductive oxide, or a multilayer including the same materials. For example, the first electrode E1 may have a triple layer structure of indium tin oxide (ITO)/silver (Ag)/indium tin oxide (ITO).

A transistor composed of the gate electrode GE, the semiconductor layer ACT, the source electrode SE, and the drain electrode DE may be connected to the first electrode E1 to supply a current to the light emitting element.

In the cross-section diagram of FIG. 7, it may be shown as a configuration including only one semiconductor layer ACT under the first electrode E1. However, in case that the oxide semiconductor layer, an oxide semiconductor layer may be further included. Thus, a layered structure including the semiconductor layer, the first gate conductive layer, the second gate conductive layer, the oxide semiconductor layer, the third gate conductive layer, the first data conductive layer, and the second data conductive layer may be provided.

A pixel defining layer PDL may be positioned on the second insulating layer IL2 and the first electrode E1.

Figure 8:
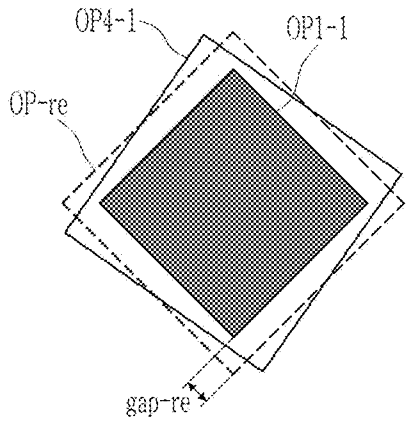
FIG. 8 and FIG. 9 are schematic top plan views for some configurations of a display area according to an embodiment.

The pixel defining layer PDL may overlap at least a portion of the first electrode E1 and may have a first-first opening OP1-1 (hereinafter referred to as a pixel opening) defining the light emission area. The first-first opening OP1-1 may have a planar shape substantially similar to a planar shape of the first electrode E1. Although the first-first opening OP1-1, as shown in FIG. 8, and is shown in a circular shape on a plane, embodiments are not limited thereto, and the first-first opening OP1-1 may have various shapes such as a rhombus, an octagonal shape similar to a rhombus, a quadrangle, a polygon, etc., or and may have a chamfered shape according to an embodiment. An embodiment with the chamfered shape is shown in FIG. 18 to FIG. 21.

The pixel defining layer PDL may include an organic insulator. In another example, the pixel defining layer PDL may include an inorganic insulating material such as a silicon nitride, a silicon oxynitride, or a silicon oxide. In another example, the pixel defining layer PDL may include an organic insulator and an inorganic insulator. In an embodiment, the pixel defining layer PDL may include a light blocking material and may be formed in black. The light blocking material may include carbon black, carbon nanotubes, a resin or paste including a black dye, metal particles, for example, nickel, aluminum, molybdenum, and alloys thereof, metal oxide particles (e.g., chromium oxide), or metal nitride particles (e.g., chromium nitride), etc. In case that the pixel defining layer PDL includes the light blocking material, reflection of external light may be reduced by metal structures disposed under the pixel defining layer PDL. However, embodiments are not limited thereto. In an embodiment, the pixel defining layer PDL may not include a light blocking material, but may include a transmissive organic insulator.

A spacer SPC may be disposed on the pixel defining layer PDL. The spacer SPC may include an organic insulator such as a polyimide. In another example, the spacer SPC may include an inorganic insulating material such as a silicon nitride ($SiN_x$) or a silicon oxide ($SiO_x$), or may include an organic insulator and an inorganic insulator.

In an embodiment, the spacer SPC and the pixel defining layer PDL may include the same material. For example, the pixel defining layer PDL and the spacer SPC may be formed together in a mask process using a halftone mask or the like. In an embodiment, the pixel defining layer PDL and the spacer SPC may include different materials.

An emission layer EML may be positioned on the first electrode E1. The emission layer EML may include organic and/or inorganic materials. The emission layer EML may generate a certain colored color light. The emission layer EML may be formed to be positioned only within the first-first opening OP1-1 of the pixel defining layer by using a mask or an inkjet process. Since the emission layer EML is positioned only within the first-first opening OP1-1 of the pixel defining layer PDL, the boundary area of the first-first opening OP1-1 in a plan view may be aligned with the boundary area of the emission layer EML.

A first functional layer FL1 may be positioned between the emission layer EML and the first electrode E1, and a second functional layer FL2 may be positioned between the emission layer EML and the second electrode E2.

The first functional layer FL1 may include at least one of a hole injection layer (HIL) and a hole transporting layer (HTL), and the second functional layer FL2 may include at least one of an electron transporting layer (ETL) and an electron injection layer (EIL).

In case that the emission layer EML is disposed for each pixel to correspond to the first-first opening OP1-1 of the pixel defining layer PDL, the first functional layer FL1 and the second functional layer FL2 may be integral with each other to cover the substrate SUB as a whole. For example, the first functional layer FL1 and the second functional layer FL2 may be integral with each other to cover (e.g., entirely cover) the display area DA of the substrate SUB, respectively.

A second electrode E2 may be positioned on the emission layer EML. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), molybdenum (Mo), or the like, or a transparent conductive oxide (TCO) such as an indium tin oxide (ITO) or an indium zinc oxide (IZO).

The first electrode E1, the emission layer EML, and the second electrode E2 may form the light emitting element ED. For example, the first electrode E1 may be an anode that is a hole injection electrode, and the second electrode E2 may be a cathode that is an electron injection electrode. However, the embodiment is not limited thereto, and according to the driving method of an emissive display device, the first electrode E1 may be a cathode, and the second electrode E2 may be an anode.

Holes and electrons may be respectively injected into the emission layer EML from the first electrode E1 and the second electrode E2, and light may be emitted in case that excitons combined with the injected holes and electrons fall from an excited state to a ground state.

An encapsulation layer ENC may be positioned on the second electrode E2. The encapsulation layer ENC may cover and seal the side as well as the upper surface of the light emitting element. Since the light emitting element is very vulnerable to moisture and oxygen, the encapsulation layer ENC may seal the light emitting element to block the inflow of an external moisture and oxygen.

The encapsulation layer ENC may include layers. The encapsulation layer ENC may be formed as a composite film including both an inorganic layer and an organic layer. For example, the encapsulation layer ENC may be formed as a triple layer in which a first encapsulation inorganic layer EIL1, an encapsulation organic layer EOL, and a second encapsulation inorganic layer EIL2 may be sequentially formed.

The first encapsulation inorganic layer EIL1 may cover the second electrode E2. The first encapsulation inorganic layer EIL1 may prevent external moisture or oxygen from penetrating (or permeating) into the light emitting element. For example, the first encapsulation inorganic layer EIL1 may include a silicon nitride, a silicon oxide, a silicon oxynitride, or a combination thereof. The first encapsulation inorganic layer EIL1 may be formed through a deposition process.

The encapsulation organic layer EOL may be disposed on the first encapsulation inorganic layer EIL1 and in contact with the first encapsulation inorganic layer EIL1. Curves formed on the upper surface of the first encapsulation inorganic layer EIL1 or particles existing on the first encapsulation inorganic layer EIL1 may be covered by the encapsulation organic layer EOL, thereby preventing or blocking the influence of the surface state of the upper surface of the first encapsulation inorganic layer EIL1 on the components formed on the encapsulation organic layer EOL. For example, the encapsulation organic layer EOL may relieve (or reduce) stress between contacting layers. The encapsulation organic layer EOL may include organic materials, and may be formed through a solution process such as spin coating, slit coating, or an inkjet process.

The second encapsulation inorganic layer EIL2 may be disposed on the encapsulation organic layer EOL to cover the encapsulation organic layer EOL. The second encapsulation inorganic layer EIL2 may be stably formed on a relatively flat surface compared to the first encapsulation inorganic layer EIL1. The second encapsulation inorganic layer EIL2 may encapsulate the encapsulation organic layer EOL to prevent or block moisture permeated from the outside through the encapsulation organic layer EOL. The second encapsulation inorganic layer EIL2 may include a silicon nitride, a silicon oxide, a silicon oxynitride, or a combination thereof. The second encapsulation inorganic layer EIL2 may be formed through a deposition process.

On the encapsulation layer ENC, a lower touch insulating layer TIL0, a first conductive layer TL1, a first touch insulating layer TIL1 and a second conductive layer TL2 may be sequentially positioned. The lower touch insulating layer TIL0, the first conductive layer TL1, the first touch insulating layer TIL1 and the second conductive layer TL2 may form the touch sensor TS described in FIG. 3.

The lower touch insulating layer TIL0 may be positioned on the encapsulation layer ENC, and according to an embodiment of FIG. 7, the lower touch insulating layer TIL0 may be formed on the second encapsulation inorganic layer EIL2. The lower touch insulating layer TIL0 may be disposed on the second encapsulation inorganic layer EIL2 to planarize the surface on which the first conductive layer TL1 and the like are disposed. The lower touch insulating layer TIL0 may include an inorganic insulator such as a silicon oxide ($SiO_x$), a silicon nitride ($SiN_x$), a silicon oxynitride ($SiO_xN_y$), or the like, or may include an organic insulator according to an embodiment.

For example, according to an embodiment, the lower touch insulating layer TIL0 may be omitted and the first conductive layer TL1 may be disposed (e.g., directly disposed) on the encapsulation layer ENC. For example, the first conductive layer TL1 may be disposed (e.g., directly disposed) on the second encapsulation inorganic layer EIL2 of the encapsulation layer ENC. However, embodiments are not limited thereto.

In an embodiment, the first touch insulating layer TIL1 may be disposed on the first conductive layer TL1. The first touch insulating layer TIL1 may be formed of an inorganic or organic material. In case that the first touch insulating layer TIL1 is provided as an inorganic material, the first touch insulating layer TIL1 may include at least one material selected from a group including a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide and a silicon oxynitride. In case that the first touch insulating layer TIL1 is provided as an organic material, the first touch insulating layer TIL1 may include at least one material selected from a group including an acryl-based resin, a methacrylic resin, polyisoprene, a vinyl-based resin, an epoxy-based resin, a urethane-based resin, a cellulose-based resin, and a perylene-based resin.

In an embodiment, the second conductive layer TL2 may be disposed on the first touch insulating layer TIL1. The second conductive layer TL2 may function as a sensor that detects the user's touch input. The first conductive layer TL1 may function as a connector connecting the patterned second conductive layer TL2 in a direction. In an embodiment, both the first conductive layer TL1 and the second conductive layer TL2 may function as sensors. For example, the first conductive layer TL1 and the second conductive layer TL2 may be connected (e.g., electrically connected) through a contact hole. As described above, as both the first conductive layer TL1 and the second conductive layer TL2 function as sensors, the resistance of the touch electrode may be reduced, so that the user's touch input may be quickly sensed.

In an embodiment, the first conductive layer TL1 and the second conductive layer TL2 may have a mesh structure so that light emitted from the light emitting element ED may pass through. For example, the first conductive layer TL1 and the second conductive layer TL2 may be disposed so as to not overlap the emission layer EML.

The first conductive layer TL1 and the second conductive layer TL2 may include a metal layer or a transparent conductive layer. The metal layer may include molybdenum (Mo), silver (Ag), titanium (Ti), copper (Cu), aluminum (Al), and alloys thereof. The transparent conductive layer may include a transparent conductive oxide such as an indium tin oxide (ITO), an indium zinc oxide (IZO), a zinc oxide (ZnO), or an indium tin zinc oxide (ITZO). For example, the transparent conductive layer may include a conductive polymer such as PEDOT, a metal nanowire, carbon nanotubes, or graphene.

The first organic layer OL1 may be positioned on the second conductive layer TL2. The first organic layer OL1 may overlap at least a portion of the pixel defining layer PDL.

The first organic layer OL1 may include a light transmissive organic material with a low refractive index. For example, the first organic layer OL1 may include at least one of an acrylic resin, a polyimide resin, a polyamide resin, and Alq3 [tris(8-hydroxyquinolinato)aluminum]. The first organic layer OL1 may have a relatively smaller refractive index than the second organic layer OL2, which will be described below.

The first organic layer OL1 may include a fourth-first opening OP4-1 (hereinafter referred to as a rotation opening or an opening including a protruding opening portion and a recessed opening portion) overlapping the first-first opening OP1-1.

The fourth-first opening OP4-1 may overlap the first-first opening OP1-1 of the pixel defining layer PDL. In a plan view, the fourth-first opening OP4-1 may be larger than the first-first opening OP1-1, and the fourth-first opening OP4-1 may have a shape surrounding the first-first opening OP1-1. The fourth-first opening OP4-1 may have various planar structures such as a rhombus or octagonal shape similar to a rhombus, a quadrangle, a polygon, and an oval, as described in FIG. 8 and FIG. 9, etc., in more detail.

A second organic layer OL2 may be positioned on the first organic layer OL1. The second organic layer OL2 may have a shape that overlaps the front surface of the substrate SUB. The second organic layer OL2 may include a light transmissive organic material with a high refractive index. The second organic layer OL2 may have a relatively larger refractive index than the first organic layer OL1.

The second organic layer OL2 may be formed of an organic insulating material. The refractive index of the second organic layer OL2 may be adjusted according to a functional group included in the layer. In another example, the refractive index of the second organic layer OL2 may be adjusted according to the type and content of nanoparticles included in the layer.

The second organic layer OL2 may include any material having a higher refractive index than the first organic layer OL1, for example, a layer formed of a material in which hollow silica is dispersed in an acryl-based resin, a siloxane resin, or the like, and in this case, the refractive index of the second organic layer OL2 may be about 1.30 to about 1.53. In another example, the second organic layer OL2 may include a layer formed of an acryl-based resin including fluoride (F), and in this case, the refractive index of the second organic layer OL2 may be about 1.38 to about 1.53. In another example, the second organic layer OL2 may include a layer formed of a material including a functional group such as an aromatic ring in a binder of a resin such as an acryl-based resin, a siloxane resin, a polyimide, etc., and in this case, the refractive index of the second organic layer OL2 may be about 1.50 to about 1.65. In another example, the second organic layer OL2 may include a layer formed of an acryl-based resin including halogen elements such as iodine (I) and bromine (Br) or elements such as sulfur (S), phosphorus (P), and silicon (Si), and in this case, the refractive index of the second organic layer OL2 may be about 1.60 to about 1.70. In another example, the second organic layer OL2 may include a layer formed of an acryl-based resin including nano particles such as titanium dioxide ($TiO_2$), zirconium dioxide ($ZrO_2$), graphene, and the like, and the refractive index of the second organic layer OL2 may be about 1.50 to about 1.90. In another example, the second organic layer OL2 may include a layer formed of an organometallic polymer including an acryl-based resin, a siloxane resin, and the like, and the refractive index of the second organic layer OL2 may be about 1.60 to about 1.90. The refractive index mentioned above may be a value measured by using light (e.g., sodium D-line) of about 589 nm.

The second organic layer OL2 may be positioned within the fourth-first opening OP4-1 of the first organic layer OL1. For example, the second organic layer OL2 may be in contact with the side surface of the first organic layer OL1. For example, the second organic layer OL2 may be positioned in a shape covering the upper surface of the first organic layer OL1.

The first organic layer OL1 and the second organic layer OL2 may be separated by the boundary area of the fourth-first opening OP4-1 of the first organic layer OL1, and at least a portion of the light generated from the light emitting element ED or the emission layer EML may be reflected (e.g., totally reflected) at the interface (or contact surface) between the first organic layer OL1 and the second organic layer OL2, e.g., the boundary area of the fourth-first opening OP4-1, so that the light may be condensed to the front and the luminance at the front may be increased. For example, the light generated from the emission layer EML may be emitted in various directions, and at least a portion of the light incident on the second organic layer OL2 may be curved at the interface (or contact surface) between the first organic layer OL1 and the second organic layer OL2 (e.g., the boundary area of the fourth-first opening OP4-1) and may be emitted to the front. In case that the incident angle of light transmitted to the interface (or contact surface) between the first organic layer OL1 and the second organic layer OL2 (e.g., the boundary area of the fourth-first opening OP4-1) after being incident to the second organic layer OL2 is greater than a threshold angle, the incident light may be reflected (e.g., totally reflected) at the interface (or contact surface) of the first organic layer OL1 and the second organic layer OL2. For example, the total reflection may occur at the interface (or contact surface) between the first organic layer OL1 and the second organic layer OL2 in case that light incident on the second organic layer OL2 having a relatively large refractive index travels to the first organic layer OL1 having a relatively small refractive index. Due to this, a merit that the front luminance is increased may be obtained.

Hereinafter, the relationship of the fourth-first opening OP4-1 of the first organic layer OL1 and the first-first opening OP1-1 of the pixel defining layer PDL according to an embodiment is described in more detail with reference to FIG. 8 and FIG. 9.

Figure 9:
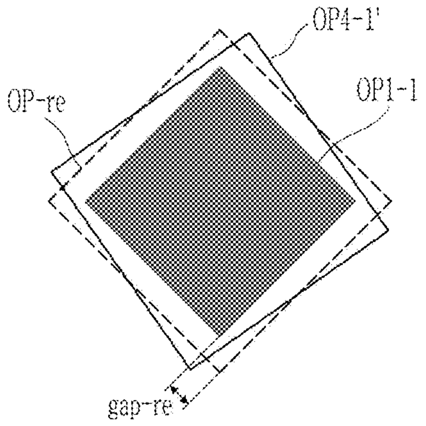

FIG. 8 and FIG. 9 are schematic top plan views for some configurations of a display area according to an embodiment.

FIG. 8 and FIG. 9 show the relationship of the first-first opening OP1-1 of the pixel defining layer PDL and the fourth-first openings OP4-1 and OP4-1' of the first organic layer OL1 according to an embodiment, and in addition, an optimal opening OP-re (hereinafter referred to as a virtual opening) of the first organic layer OL1 where a maximum front luminance ratio MAX is obtained is illustrated by a dotted line. The fourth-first openings OP4-1 and OP4-1' of the first organic layer OL1 shown in FIG. 8 and FIG. 9 are referred to as a rotation opening hereinafter. For example, the fourth-first openings OP4-1 and OP4-1' of the first organic layer OL1 may be an opening formed by increasing the planar shape of the first-first opening OP1-1 of the pixel defining layer PDL by a certain ratio and rotating the first-first opening OP1-1 by a certain angle in a direction (e.g., clockwise direction or counterclockwise direction).

For example, an optimal opening OP-re may be formed by increasing the planar shape of the first-first opening OP1-1 of the pixel defining layer PDL by a certain ratio. According to an embodiment, the certain ratio may be about 1, and the first-first opening OP1-1 of the pixel defining layer PDL and the optimal opening OP-re may have substantially the same size or the same shape.

Referring to FIG. 8, the fourth-first opening OP4-1 of the first organic layer OL1 may be to rotate the optimal opening OP-re of the first organic layer OL1 in a counterclockwise direction with respect to the center by a certain angle. Referring to FIG. 9, the fourth-first opening OP4-1' of the first organic layer OL1 may be to rotate the optimal opening OP-re of the first organic layer OL1 in a clockwise direction with respect to the center by a certain angle. In FIG. 8 and FIG. 9, each rotation angle in the counterclockwise direction and the clockwise direction may be the same angle, and may have a value greater than about 0 degrees and less than or equal to about 45 degrees. The structure of FIG. 8 and FIG. 9 may be alternately disposed in one display area, and the arrangement method may be varied, and some embodiments are described through FIG. 18 to FIG. 21.

In FIG. 8 and FIG. 9, the first-first opening OP1-1 of the pixel defining layer PDL may be positioned within the fourth-first openings OP4-1 and OP4-1' of the first organic layer OL1 in a plan view. For example, the first-first opening OP1-1 of the pixel defining layer PDL and the fourth-first openings OP4-1 and OP4-1' of the first organic layer OL1 may have a structure overlapping each other in a plan view. As the emission layer EML is positioned in the first-first opening OP1-1 of the pixel defining layer PDL, the emission layer EML may be positioned within the fourth-first openings OP4-1 and OP4-1' of the first organic layer OL1 in a plan view. Thus, the emission layer EML and the fourth-first openings OP4-1 and OP4-1' of the first organic layer OL1 may have the structure overlapping each other.

Referring to FIG. 7, since the second organic layer OL2 is positioned on the first organic layer OL1 and the second organic layer OL2 is positioned within the fourth-first opening OP4-1 of the first organic layer OL1, the protruded portion of the second organic layer OL2 (e.g., the portion within the fourth-first opening OP4-1) may have the structure overlapping the first-first opening OP1-1 of the pixel defining layer PDL on a plane.

At least a portion of the light generated from the emission layer EML may be refracted or totally reflected at the interface (or contact surface) between the first organic layer OL1 and the second organic layer OL2, e.g., at the boundary area of the fourth-first openings OP4-1 and OP4-1' to the front of the display panel. Thus, light may be focused to the front, and the luminance at the front may be increased.

In FIG. 8 and FIG. 9, the fourth-first openings OP4-1 and OP4-1' have a rhombus shape, but may have various planar structures such as polygon shapes such as octagonal similar to a rhombus, a quadrangle, a polygon, an oval, etc. according to an embodiment.

The optimal opening OP-re of the first organic layer OL1 represented by the dotted line in FIG. 8 and FIG. 9 is described in more detail with reference to FIG. 10.

Figure 10:
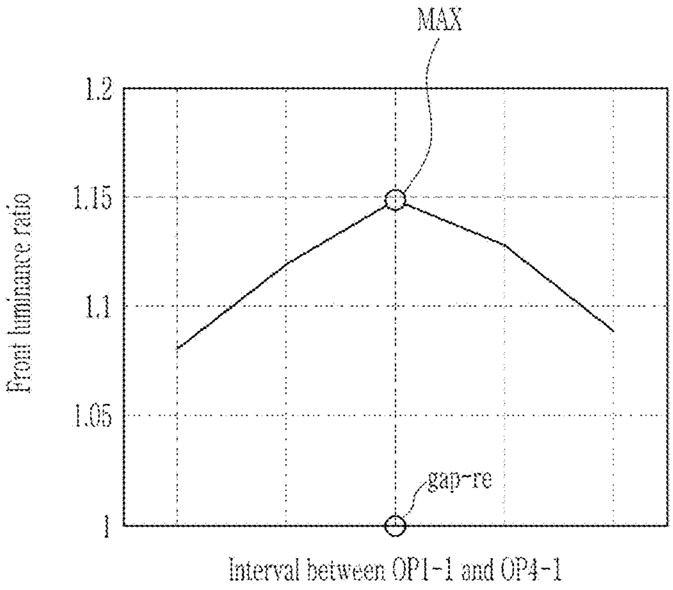
FIG. 10 is a schematic view showing a front luminance ratio according to a separation distance between an opening of a first organic layer and an opening of a pixel defining layer.

FIG. 10 is a schematic view showing a front luminance ratio according to a separation distance between an opening of a first organic layer and an opening of a pixel defining layer.

FIG. 10 shows a graph showing a position of an optimal opening OP-re of a first organic layer OL1 according to an embodiment.

In FIG. 10, an x-axis represents an interval value (or distance) between the fourth-first opening OP4-1 of the first organic layer OL1 and the first-first opening OP1-1 of the pixel defining layer PDL in a plan view, and a y-axis represents a front luminance ratio.

FIG. 10 illustrates that the interval value (or distance) between the fourth-first opening OP4-1 of the first organic layer OL1 and the first-first opening OP1-1 of the pixel defining layer PDL has the maximum front luminance ratio MAX at a specific position.

Therefore, the position of the optimal opening OP-re of the first organic layer OL1, indicated by the dotted line in FIG. 8 and FIG. 9, may be away from the first-first opening OP1-1 of the pixel defining layer PDL by the interval value (or distance) gap-re at which the front luminance ratio is a maximum outward, and the embodiment of FIG. 10 shows that the interval value on a plane between the fourth-first opening OP4-1 of the first organic layer OL1 and the first-first opening OP1-1 of the pixel defining layer PDL may be the interval value gap-re in case that the front luminance ratio is a maximum.

For example, the size of the first-first opening OP1-1 of the pixel defining layer PDL may determine the lifetime of the emission layer EML, and the size of the first-first opening OP1-1 of the pixel defining layer PDL may be determined according to which material the emission layer EML uses. Therefore, in case that the size of the first-first opening OP1-1 of the pixel defining layer PDL is determined according to the material of the emission layer EML, the position of the optimal opening OP-re of the first organic layer OL1 may be determined or defined by forming the optimal opening OP-re of the first organic layer OL1 as large as the distance having the maximum front luminance ratio MAX of FIG. 10.

Hereinafter, the characteristics of forming the fourth-first opening OP4-1 of the first organic layer OL1 having substantially the same structure as FIG. 8 and FIG. 9 by rotating the optimal opening OP-re of the first organic layer OL1 will be described through FIG. 11 to FIG. 13.

Figure 11:
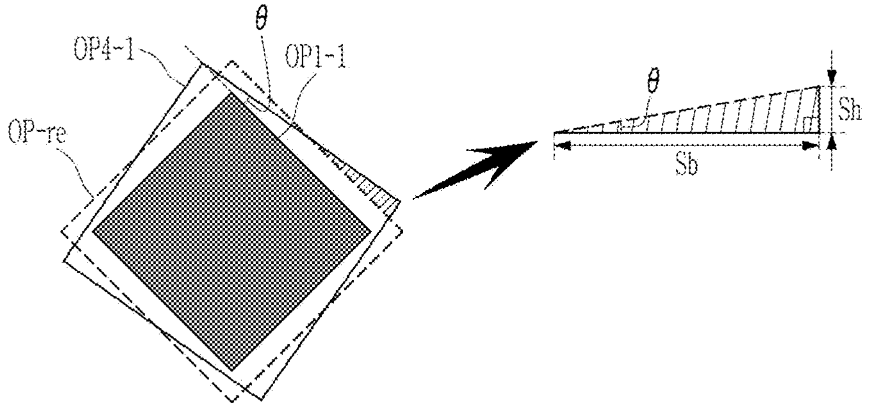
FIG. 11 is a schematic view showing a characteristic of an opening of a first organic layer according to an embodiment.
Figure 12:
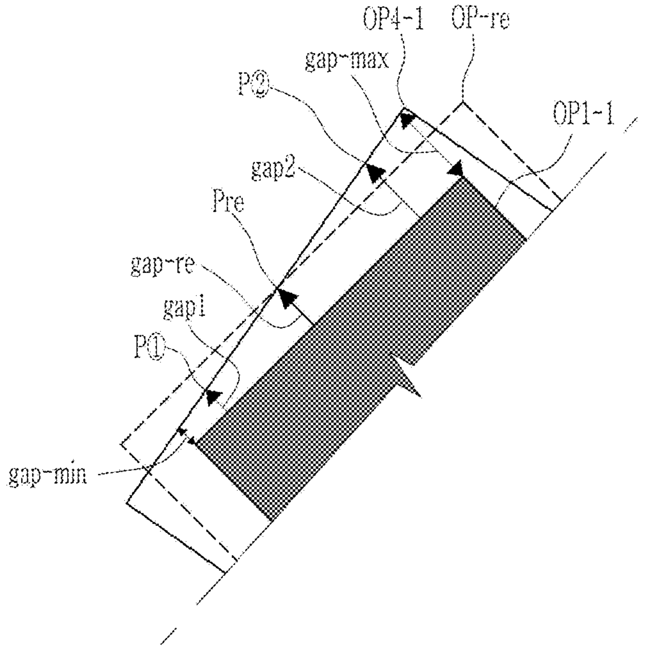
FIG. 12 and FIG. 13 are schematic views explaining a front luminance ratio according to an embodiment.
Figure 13:
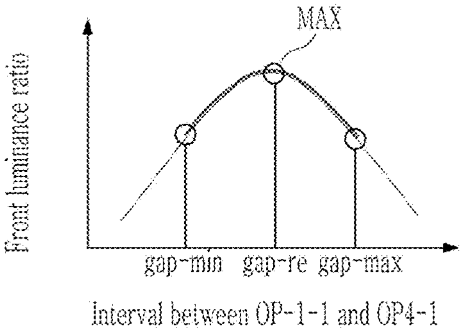

FIG. 11 and FIG. 12 are schematic views showing a characteristic of an opening of a first organic layer according to an embodiment, and FIG. 13 is a schematic view explaining a front luminance ratio according to an embodiment.

FIG. 11 and FIG. 12 are cases of a certain angle rotation in the counterclockwise direction like FIG. 8, FIG. 11 is the case enlarging a triangle shape generated by the rotation, and FIG. 12 is the case enlarging a part.

Referring to FIG. 11, the triangle shape generated by the rotation may be enlarged and illustrated.

The hypotenuse of the triangle may be a part of a side of the optimal opening OP-re of the first organic layer OL1, and the other two sides may be parts of two sides of the fourth-first opening OP4-1 of the first organic layer OL1.

In order to increase the resolution, the interval (or interval value) between the fourth-first opening OP4-1 of the adjacent first organic layer OL1 may be narrowed. As a height Sh of the triangle in FIG. 11 may have a value of about 0.5 μm, and a length of a base side Sb may have a value of about 10 μm or more and about 30 μm or less, and in case that an angle (θ) is calculated by using the tangent value, the angle (θ) of the triangle of FIG. 11 may have a value of about 5.71 degrees or less and about 1.9 degrees or more. However, considering that the values of the base Sb and the height Sh may be slightly changed in an embodiment, the angle (θ) of the triangle of FIG. 11 may have a value of about 1.5 degrees or more and about 6 degrees or less. As the angle (θ) of the triangle corresponds to the angle at which the optimal opening OP-re of the first organic layer OL1 is rotated in the clockwise direction or the counterclockwise direction, the fourth-first opening OP4-1 of the first organic layer OL1 may be formed by rotating the optimal opening OP-re of the first organic layer OL1 by the angle of about 1.5 degrees or more and about 6 degrees or less. According to an embodiment, the height Sh of the triangle may have a value greater than about 0 μm and less than or equal to about 1.5 μtm, and in this case, the height Sh of the triangle may be the shortest side of the triangle.

For example, since the first-first opening OP1-1 of the pixel defining layer PDL and the optimal opening OP-re of the first organic layer OL1 have the sides that are respectively parallel to each other, the angle where the extended side of the first-first opening OP1-1 of the pixel defining layer PDL meets the side (or the extended side thereof) of the fourth-first opening OP4-1 of the first organic layer OL1, as shown in FIG. 11, may have the same angle θ as the angle θ of the triangle. Therefore, the angle where the extension line of a side of the first-first opening OP1-1 of the pixel defining layer PDL and a side or the extension line of the fourth-first opening OP4-1 of the first organic layer OL1 meet may be between about 1.5 and about 6 degrees.

FIG. 12 shows and compares the interval (or interval value) between the first-first opening OP1-1 of the pixel defining layer PDL and the fourth-first opening OP4-1 of the first organic layer OL1, which are formed on the actual display panel, as three arrows.

Since the optimal opening OP-re of the first organic layer OL1 is rotated to form the fourth-first opening OP4-1 of the first organic layer OL1, the interval value from a side of the first-first opening OP1-1 of the pixel defining layer PDL to the fourth-first opening OP4-1 of the first organic layer OL1 may have a value that is gradually changed. For example, at a point Pre where the optimal opening OP-re of the first organic layer OL1 and the fourth-first opening OP4-1 of the first organic layer OL1 meet, the interval (or interval value) between the first-first opening OP1-1 of the pixel defining layer PDL and the fourth-first opening of OP4-1 of the first organic layer OL1 may have an interval value gap-re, and the front luminance ratio may be the maximum. According to an embodiment, the interval value gap-re may have a value greater than about 0 μm and less than or equal to about 2.0 μm. For example, a horizontal distance on a plane between the optimal opening OP-re of the first organic layer OL1 and the first-first opening OP1-1 of the pixel defining layer PDL may be greater than about 0 μm and less than or equal to about 2.0 μm.

Based on the point Pre where the optimal opening OP-re of the first organic layer OL1 and the fourth-first opening OP4-1 of the first organic layer OL1 meet, the interval (or interval value) between the first-first opening OP1-1 of the pixel defining layer PDL and the fourth-first opening OP4-1 of the first organic layer OL1 gradually increases in a direction, and the interval (or interval value) between the first-first opening OP1-1 of the pixel defining layer PDL and the fourth-first opening OP4-1 of the first organic layer OL1 gradually decreases toward the opposite direction. In FIG. 12, one point PC) in which the interval (or interval value) between the first-first opening OP1-1 of the pixel defining layer PDL and the fourth-first opening OP4-1 of the first organic layer OL1 may have the value that is smaller than the interval value gap-re with the maximum front luminance ratio MAX is shown, and the interval value is shown as a first distance gap1. Therefore, a first distance gap1 may have a smaller value than the interval value gap-re. In FIG. 12, one point PC) in which the interval (or interval value) between the first-first opening OP1-1 of the pixel defining layer PDL and the fourth-first opening OP4-1 of the first organic layer OL1 may have the value that is larger than the interval value gap-re with the maximum front luminance ratio MAX is shown, and the interval value is shown as a second distance gap2. Therefore, the second distance gap2 may have a larger value than the interval value gap-re.

In the structure in which the interval (or interval value) between the first-first opening OP1-1 of the pixel defining layer PDL and the fourth-first opening OP4-1 of the first organic layer OL1 is gradually changed, a position where the interval value has a maximum value gap-max and a position where the interval value has a minimum value gap-min may exist.

In an embodiment, a difference from the minimum value gap-min to the maximum value gap-max of the interval (or interval value) between the first-first opening OP1-1 of the pixel defining layer PDL and the fourth-first opening OP4-1 of the first organic layer OL1 may have a value greater than about 0 μm and less than or equal to about 3 μm. For example, the difference from the minimum value gap-min to the maximum value gap-max of the interval (or interval value) between the first-first opening OP1-1 of the pixel defining layer PDL and the fourth-first opening OP4-1 of the first organic layer OL1 may be measured as a horizontal distance in a direction perpendicular to a side of the first-first opening OP1-1 of the pixel defining layer PDL on a plane. Therefore, the difference between the minimum value and the maximum value among the horizontal distances between a side of the first-first opening OP1-1 of the pixel defining layer PDL and a side of the fourth-first opening OP4-1 of the first organic layer OL1 adjacent thereto on a plane may be greater than about 0 μm and less than or equal to about 3 μm.

A meaning of forming the fourth-first opening OP4-1 of the first organic layer OL1 by rotating the optimal opening OP-re of the first organic layer OL1 is described through a graph of FIG. 13.

In the x-axis of FIG. 13, the interval value gap-max as the maximum value and the interval value gap-min as the minimum value among the interval values between the first-first opening OP1-1 of the pixel defining layer PDL and the fourth-first opening OP4-1 of the first organic layer OL1 are shown.

Referring to FIG. 12, the interval (or interval value) between the first-first opening OP1-1 of the pixel defining layer PDL and the fourth-first opening OP4-1 of the first organic layer OL1 may be only disposed between the position with the maximum value gap-max and the position with the minimum value gap-min, and the front luminance ratio may be changed as indicated by a thick line on the graph of FIG. 13.

Therefore, in case that the optimal opening OP-re of the first organic layer OL1 is rotated to form the fourth-first opening OP4-1 of the first organic layer OL1, the front luminance value may be smaller than the maximum front luminance value MAX, but the front luminance value may be determined as the average value of the front luminance values at the positions from the maximum value gap-max to the minimum value gap-min. Therefore, compared to the cases of forming the fourth-first opening OP4-1 of the first organic layer OL1 in the optimal opening OP-re of the first organic layer OL1, or forming the fourth-first opening OP4-1 of the first organic layer OL1 to have a constant interval value from the optimal opening OP-re of the first organic layer OL1, the embodiments may have a characteristic of eliminating (or minimizing) the change in the front luminance due to errors occurring during the process. For example, the change in the front luminance may be eliminated or reduced although there is process dispersion that the size of the fourth-first opening OP4-1 of the first organic layer OL1 is deviated according to the position during the process.

In case that the fourth-first opening OP4-1 of the first organic layer OL1 is formed in the optimal opening OP-re of the first organic layer OL1 to have the maximum front luminance ratio MAX, due to the process error or the process dispersion occurring in the actual manufacturing process, the front luminance ratio may be changed according to the position, resulting in a drawback that the front luminance ratio changes according to the process error. However, although the process error or process dispersion occurs, the embodiments may have an advantage that the display quality is constant as a whole by rotating the optimal opening OP-re of the first organic layer OL1 to form the fourth-first opening OP4-1 of the first organic layer OL1, because the front luminance ratio does not change much.

Hereinafter, it is described that the front luminance ratio is not significantly changed even by the process error or the process dispersion with reference to FIG. 14 to FIG. 17 in detail.

FIG. 14 to FIG. 17 are schematic views explaining a characteristic according to a size change of an opening of a first organic layer in an embodiment.

Figure 14A:
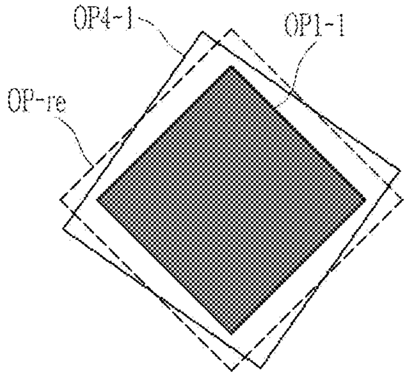
FIGS. 14A, 14B, 15, 16A, 16B, 17 are schematic views explaining a characteristic according to a size change of an opening of a first organic layer in an embodiment.
Figure 14B:
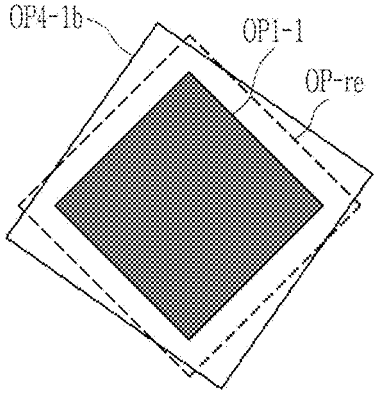
Figure 15:
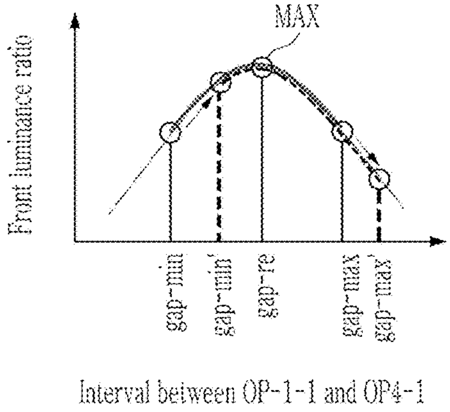

First, a case in which the process error in which the fourth-first opening OP4-1 of the first organic layer OL1 is large is described through FIG. 14 and FIG. 15.

In FIG. 14A, the fourth-first opening OP4-1 of the first organic layer OL1 having the same size as FIG. 8 is shown, and it may be the fourth-first opening OP4-1 of the first organic layer OL1 of the size to be targeted However, in case that the fourth-first opening OP4-1 of the first organic layer OL1 is actually formed, the relatively large fourth-first opening OP4-1*b* may be formed as in FIG. 14B. Like FIG. 14B, in case that the large fourth-first opening OP4-1*b* is formed, the interval (or interval value) between the first-first opening OP1-1 of the pixel defining layer PDL and the fourth-first opening OP4-1 of the first organic layer OL1 is increased, as shown in FIG. 15, the original maximum value gap-max and minimum value gap-min may be changed to the changed maximum value gap-max' and minimum value gap-min' shifted to the right direction, respectively.

Therefore, in case that the fourth-first opening OP4-1*b* formed as large as in FIG. 14B is used, as shown in FIG. 15, the average front luminance ratio may be decreased in case that the front luminance ratio is shifted to the right direction. However, since the front luminance ratio is continuously changed with the interval value that is continuously changed, the average front luminance ratio that is actually reduced may have a merit that it is not large.

Figure 16A:
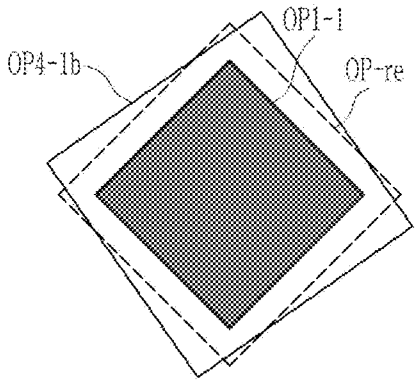
Figure 16B:
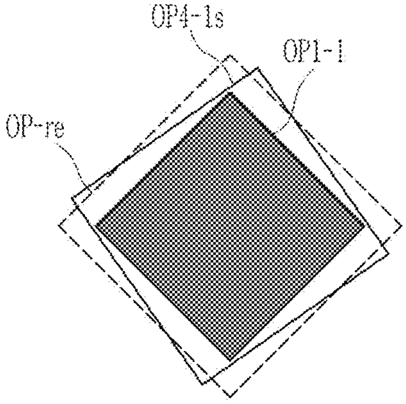
Figure 17:
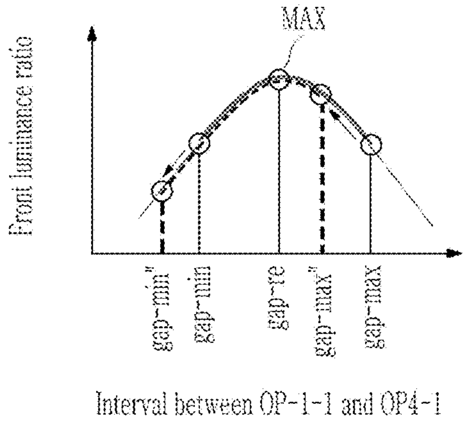

For example, a case in which the process error in which the fourth-first opening OP4-1 of the first organic layer OL1 is formed small is described through FIG. 16 and FIG. 17.

FIG. 16A shows the fourth-first opening OP4-1 of the first organic layer OL1 having the same size as FIG. 8 and is the fourth-first opening OP4-1 of the first organic layer OL1 of the size to be targeted. However, in case that the fourth-first opening OP4-1 of the first organic layer OL1 is actually formed, a relatively small fourth-first opening OP4-1*s* may be formed as in FIG. 16B.

As shown in FIG. 16B, in case that the small fourth-first opening OP4-1*s* is formed, the interval (or interval value) between the first-first opening OP1-1 of the pixel defining layer PDL and the fourth-first opening OP4-1 of the first organic layer OL1 is described, as shown in FIG. 17, the original maximum value gap-max and minimum value gap-min may be changed to the changed maximum value gap-max" and minimum value gap-min" shifted to the left direction, respectively.

Therefore, in case that the fourth-first opening OP4-1*s* formed large as in FIG. 16B is used, as shown in FIG. 17, the average front luminance ratio may be decreased in case that the front luminance ratio is shifted to the left direction. However, since the front luminance ratio is continuously changed due to the interval value that is continuously changed, the average front luminance ratio that is actually reduced may have a merit that it is not large.

As shown in the embodiment of FIG. 16 and FIG. 17, although the relatively small fourth-first opening OP4-1*s* is formed, the first-first opening OP1-1 of the pixel defining layer PDL may be formed to be positioned all within the small fourth-first opening OP4-1*s* in a plan view, so that the front luminance ratio may not be lowered.

Hereinafter, various embodiments including two fourth-first openings OP4-1 and OP4-1' of the first organic layer OL1 formed by the rotation in the different directions as shown in FIG. 8 and FIG. 9 are described with reference to FIG. 18 to FIG. 21.

FIG. 18 to FIG. 21 are top plan views showing pixel arrangements according to an embodiment, respectively.

In FIG. 18 to FIG. 21, a red light emitting diode (LED) (or an emission layer), a green light emitting diode (LED) (or an emission layer), a blue light emitting diode (LED) (or an emission layer) are represented by "R", "G", and "B", respectively. An optimal opening OP-re of a first organic layer OL1 may be rotated in the counterclockwise direction to form the fourth-first opening OP4-1 of the first organic layer OL1, which represented by "1" and a hatch. An optimal opening OP-re of the first organic layer OL1 may be rotated in the clockwise direction to form a fourth-first opening OP4-1' of the first organic layer OL1, which is represented by "r" without the hatching. As a result, characteristics of each part may be easily checked.

In FIG. 18 to FIG. 21, the first-first opening OP1-1 of the pixel defining layer PDL and the fourth-first opening OP4-1 of the first organic layer OL1 may have a planar shape in which each corner of the rhombus is chamfered. According to an embodiment, only one of the first-first opening OP1-1 of the pixel defining layer PDL and the fourth-first opening OP4-1 of the first organic layer OL1 may have a planar shape with chamfered edges.

Hereinafter, the fourth-first opening OP4-1 of the first organic layer OL1 formed by rotating in the counterclockwise direction and the light emitting diode (LED) (or the emission layer) overlapping are referred to as counterclockwise direction pixels, and to be formed by rotating in the clockwise direction is referred to as a clockwise direction pixel.

In the embodiments of FIG. 18 to FIG. 21, the embodiment including one red light emitting diode (LED) (or one emission layer), two green light emitting diodes (LED) (or two emission layers), and one blue light emitting diode (LED) (one emission layer) is described, and according to an embodiment, the red light emitting diode (LED) (or the emission layer), the green light emitting diode (LED) (or the emission layer), and the blue light emitting diode (LED) (or the emission layer) may be disposed with a ratio of 1:1:1.

Figure 18:
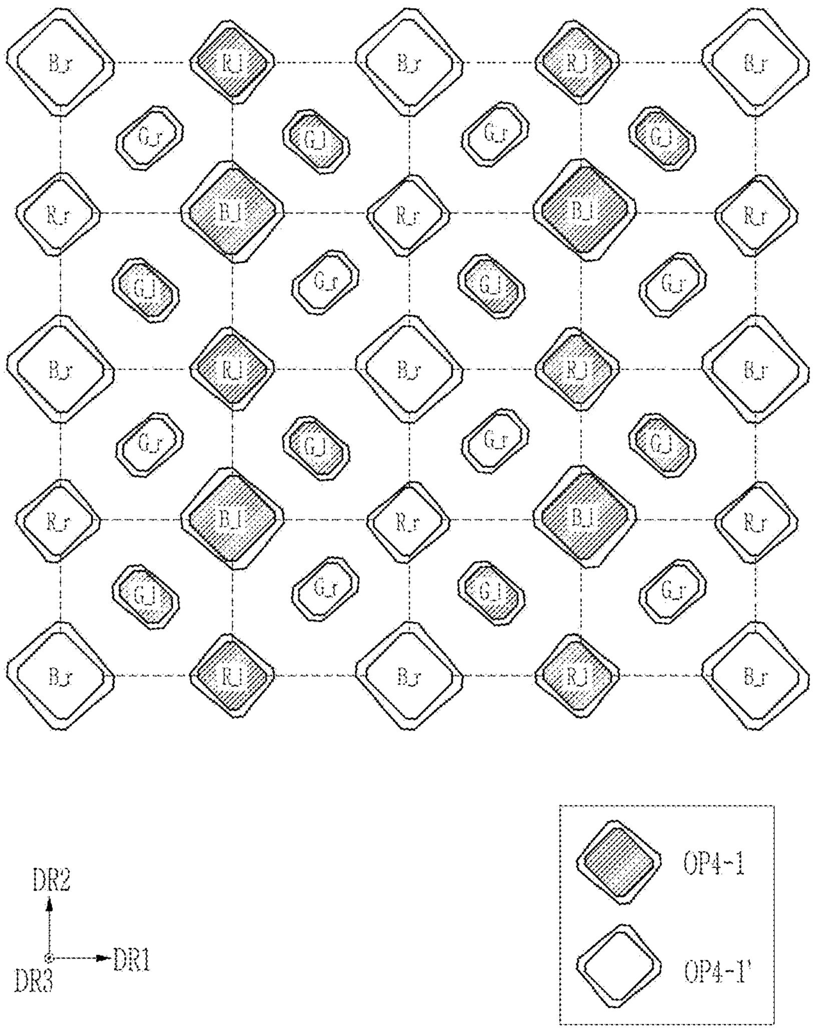
FIG. 18 to FIG. 21 are schematic top plan views showing pixel arrangements according to an embodiment.

Referring to the embodiment of FIG. 18, the red light emitting diode (LED) (or the emission layer) and the blue light emitting diode (LED) (or the emission layer) arranged along the second direction DR2 may be formed as the same pixel. For example, a column of one red and blue light emitting diode (LED) (or the emission layers) arranged along the second direction DR2 is equally formed as the counterclockwise direction pixel or the clockwise direction pixel. For example, a column of the green light emitting diode (LED) (or the emission layer) may be positioned between the adjacent columns of the red and blue light emitting diodes (LED) (or the emission layers), and the green light emitting diode (LED) (or the emission layer) may be alternately formed as the counterclockwise direction pixel and the clockwise direction pixel along the second direction DR2. According to an embodiment, the column of the green light emitting diodes (LED) (or the emission layer) may be equally formed as the counterclockwise direction pixel or the clockwise direction pixel in the second direction DR2.

Figure 19:
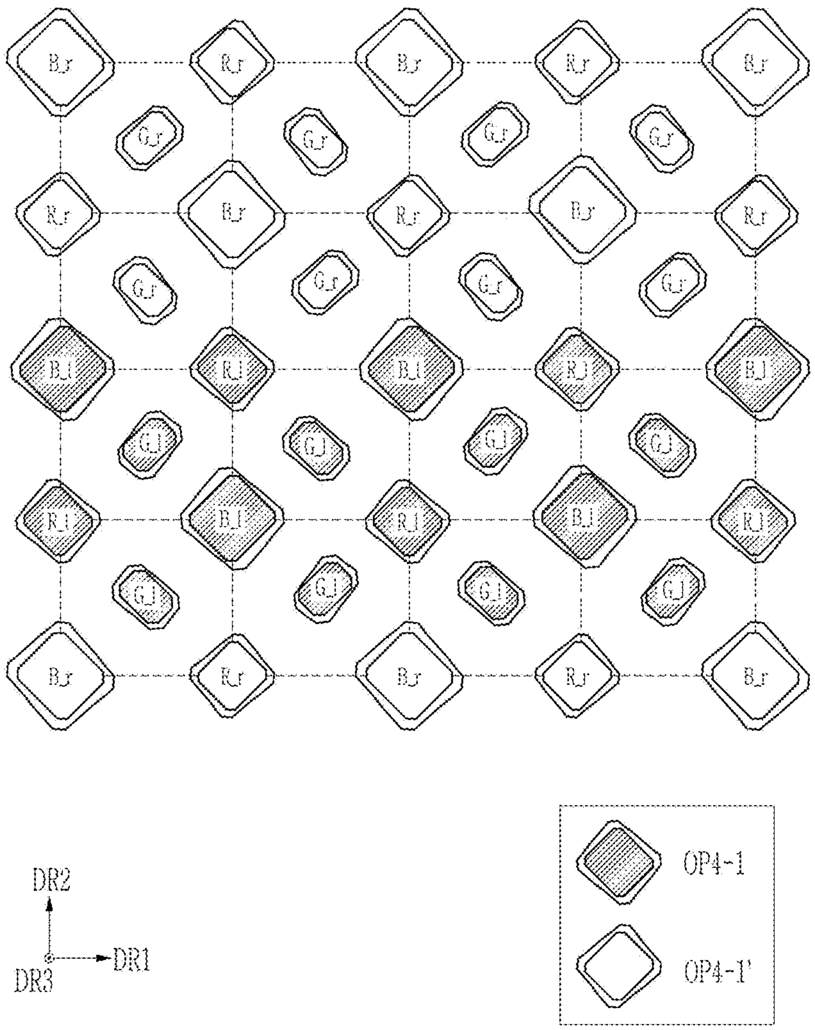

According to the embodiment of the FIG. 19, the red light emitting diode (LED) (or the emission layer) and the blue light emitting diode (LED) (or the emission layer) arranged along the first direction DR1 may be formed as the same pixel. For example, one column of the red and blue light emitting diodes (LED) (or the emission layers) arranged along the first direction DR1 may be equally formed as the counterclockwise direction pixel or the clockwise direction pixel. For example, the column of the green light emitting diode (LED) (or the emission layer) may be equally formed in the second direction DR2 as the counterclockwise direction pixel or the clockwise direction pixel. In the embodiment of FIG. 19, it may be disposed alternately every four rows extended in the first direction DR1. According to an embodiment, the arrangement of FIG. 19 may be modified. For example, the red, blue, and green light emitting diodes (LED) (or the emission layers) may be alternately disposed with the counterclockwise direction pixel and the clockwise direction pixel every three rows or every five rows extending in the first direction DR1. For example, the green light emitting diodes (LED) (or the emission layers) arranged along the first direction DR1 may be alternately formed as the counterclockwise direction pixels and the clockwise direction pixels. Referring to the embodiment of FIG. 20 and FIG. 21, one adjacent red light emitting diode (LED) (or the emission layer) and blue light emitting diode (LED) (or the emission layer) may be formed as the same pixel, e.g., the counterclockwise direction pixel or the clockwise direction pixel. For example, one of the adjacent green light emitting diodes (LEDs) (or the emission layers) may be formed as the counterclockwise direction pixel and the other may be formed as the clockwise direction pixel.

Figure 20:
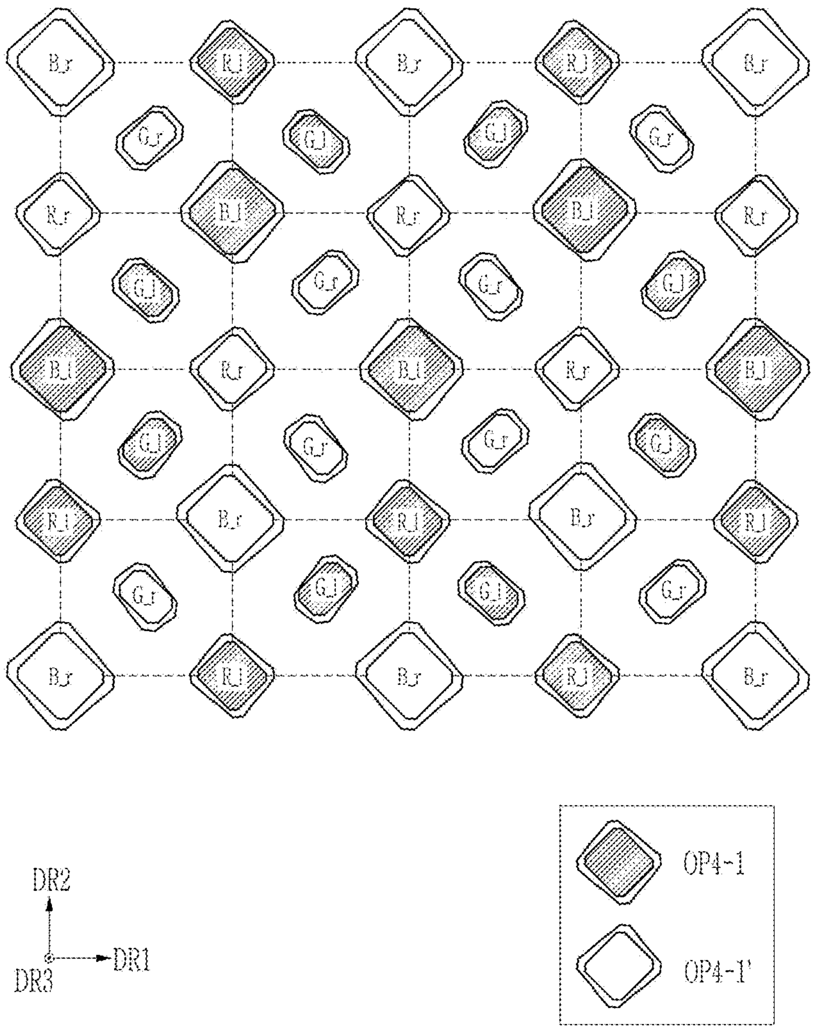

In more detail, referring to FIG. 20, one red light emitting diode (LED) (or one emission layer) and one blue light emitting diode (LED) (or one emission layer) adjacent to each other in the second direction DR2 may be formed as the same pixel.

Figure 21:
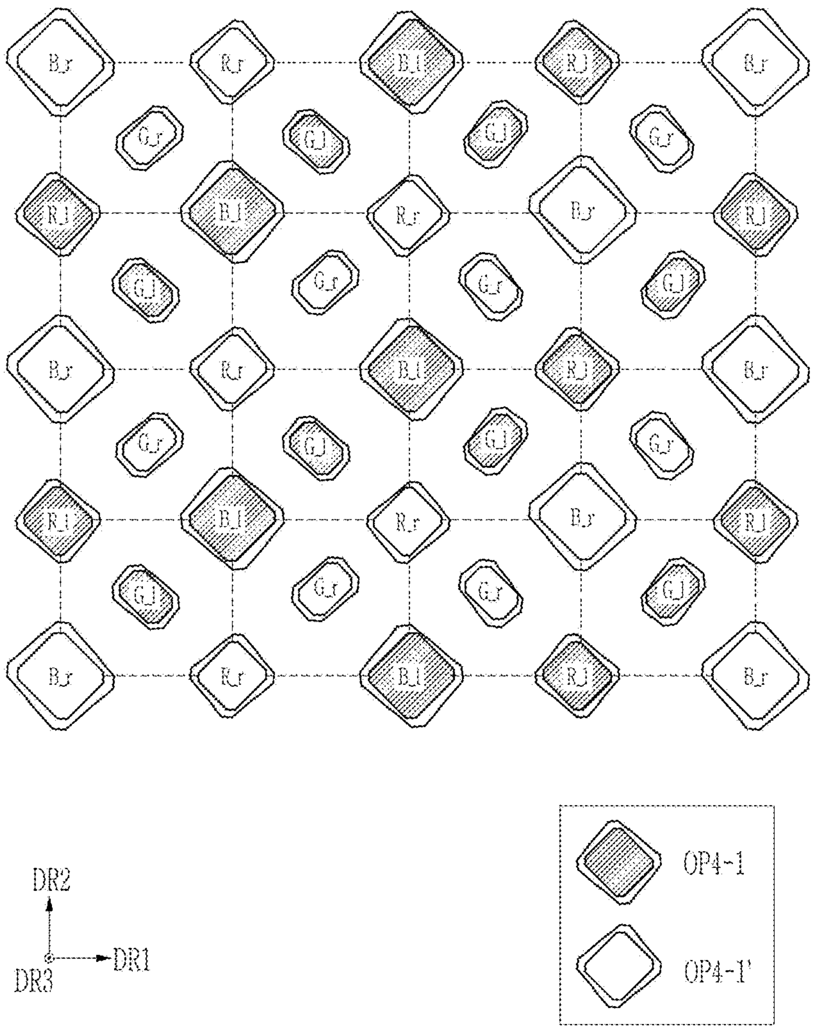

Referring to FIG. 21, one red light emitting diode (LED) (or one emission layer) and one blue light emitting diode (LED) (or one emission layer) adjacent to each other in the first direction DR1 may be formed as the same pixel.

In FIG. 20 and FIG. 21, two of four adjacent green light emitting diodes (LEDs) (or the emission layers) may be formed as the counterclockwise direction pixels, and the other two of the four adjacent green light emitting diodes (LEDs) may be formed as the clockwise direction pixels. The method of disposing the pixel in the counterclockwise direction and the pixel in a clockwise direction among four green light emitting diodes (LEDs) (or the emission layers) may be varied.

Hereinafter, unlike the fourth-first openings OP4-1 and OP4-1' of the first organic layer OL1, which are the rotation opening formed by the rotation as shown in FIG. 8 and FIG. 9, various embodiment for the fourth-first opening OP4-1*p*1, OP4-1*p*2, OP4-1*p*3, OP4-1*p*4, or OP4-1*p*5 of the first organic layer OL1 including sides having a protruded structure are described with reference to FIG. 22 to FIG. 26. Fourth-first openings OP4-1*p*1, OP4-1*p*2, OP4-1*p*3, OP4-1*p*4, and OP4-1*p*5 of the first organic layer OL1 are referred to as openings including a protruding opening portion and a recessed opening portion) hereinafter.

FIG. 22 to FIG. 26 are schematic top plan views of some configurations of a display area according to an embodiment.

In FIG. 22 to FIG. 26, as shown in FIG. 8 and FIG. 9, the first-first opening OP1-1 of the pixel defining layer PDL and the optimal opening OP-re of the first organic layer OL1 where the maximum front luminance ratio MAX is obtained are shown. In FIG. 22 to FIG. 26, the fourth-first openings OP4-1*p*1, OP4-1*p*2, OP4-1*p*3, OP4-1*p*4, and OP4-1*p*5 of the first organic layer OL1 are additionally shown. The first-first opening OP1-1 of the pixel defining layer PDL may be positioned within the fourth-first openings OP4-1*p*1, OP4-1*p*2, OP4-1*p*3, OP4-1*p*4, and OP4-1*p*5 of the first organic layer OL1 on a plane.

The fourth-first openings OP4-1*p*1, OP4-1*p*2, OP4-1*p*3, OP4-1*p*4, and OP4-1*p*5 of the first organic layer OL1 may have a portion (hereinafter, referred to as a protruding opening portion) that is protruded based on the optimal opening OP-re of the first organic layer OL1 and a portion (hereinafter, referred to as a recessed opening portion) that is positioned inside of the optimal opening OP-re of the first organic layer OL1. For example, the optimal opening OP-re of the first organic layer OL1 may be defined at the position where the front luminance ratio is maximized with in case that the optimal opening OP-re is formed in the first organic layer OL1 instead of the fourth-first opening OP4-1*p*1, OP4-1*p*2, OP4-1*p*3, OP4-1*p*4, and OP4-1*p*5 of the first organic layer OL1. For example, each side of the first-first opening OP1-1 of the pixel defining layer PDL and each side of the optimal opening OP-re may be space apart from each other by a certain horizontal distance on a plane.

For example, the fourth-first openings OP4-1*p*1, OP4-1*p*2, OP4-1*p*3, OP4-1*p*4, and OP4-1*p*5 of the first organic layer OL1 may have the protruding opening portion disposed outside of the optimal opening OP-re and the recessed opening portion positioned inside of the optimal opening OP-re. The distance at which at least two protruding opening portions among the fourth-first openings OP4-1*p*1, OP4-1*p*2, OP4-1*p*3, OP4-1*p*4, and OP4-1*p*5 of the first organic layer OL1 may be spaced apart from the side of the first-first opening OP1-1 of the corresponding pixel defining layer PDL on a plane may be the same as each other. The distance at which at least two recessed opening portions among the fourth-first openings OP4-1*p*1, OP4-1*p*2, OP4-1*p*3, OP4-1*p*4, and OP4-1*p*5 of the first organic layer OL1 are spaced apart from the side of the first-first opening OP1-1 of the corresponding pixel defining layer PDL on a plane may be the same as each other.

In the fourth-first openings OP4-1*p*1, OP4-1*p*2, OP4-1*p*3, OP4-1*p*4, and OP4-1*p*5 of the first organic layer OL1, at least two of the step differences formed by the protruding opening portion and the recessed opening portion may be the same, and the step difference formed by the protruding opening portion and the recessed opening portion at each side of the fourth-first openings OP4-1*p*1, OP4-1*p*2, OP4-1*p*3, OP4-1*p*4, and OP4-1*p*5 of the first organic layer OL1 may be greater than about 0 μm and less than or equal to about 3 μm. For example, the step difference may be the distance between the protruding opening portion and the recessed opening portion of the fourth-first opening OP4-1*p*1, OP4-1*p*2, OP4-1*p*3, OP4-1*p*4, and OP4-1*p*5 of the first organic layer OL1 for the direction perpendicular to a side of the first-first opening OP1-1 of the pixel defining layer PDL.

The embodiments of FIG. 22 to FIG. 26 may have the same cross-section structure of FIG. 7.

Figure 22:
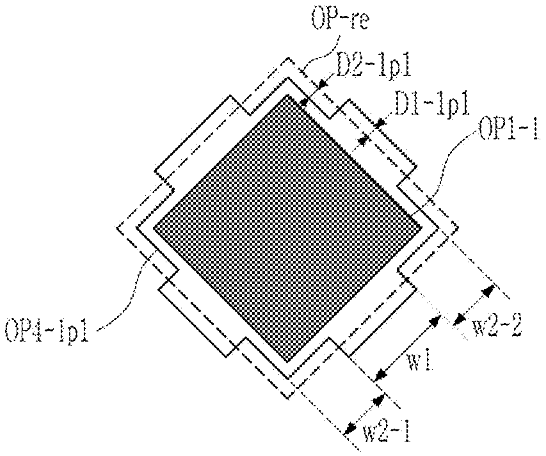
FIG. 22 to FIG. 26 are schematic top plan views of some configurations of a display area according to an embodiment.

Referring to FIG. 22, the fourth-first opening OP4-1*p*1 may be positioned outside of the first-first opening OP1-1 of the pixel defining layer PDL, and a side of the fourth-first opening OP4-1*p*1 may be divided into the protruding opening portion and the recessed opening portion positioned inside of the optimal opening OP-re of the first organic layer OL1 shown by a dotted line.

The distance D1-1*p*1 from the optimal opening OP-re of the first organic layer OL1 to the protruding opening portion outside of the optimal opening OP-re of the first organic layer OL1 may be the same as the distance D2-1*p*1 from the optimal opening OP-re of the first organic layer OL1 to the recessed opening portion disposed inside of the optimal opening OP-re of the first organic layer OL1.

In the embodiment of FIG. 22, a side of the fourth-first opening OP4-1*p*1 may include one protruding opening portion and two recessed opening portions positioned sides (e.g., opposite sides) thereof. For example, the width w1 of the protruding opening portion and the sum of the widths w2-1 and w2-2 of two recessed opening portions on a side of the fourth-first opening OP4-1*p*1 may be the same as each other.

Figure 23:
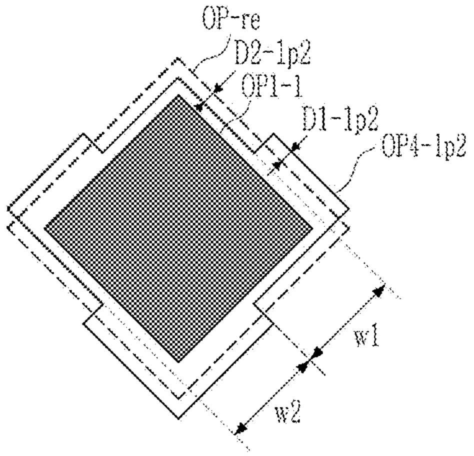

In the embodiment of FIG. 23 unlike the embodiment of FIG. 22, one protruding opening portion and one recessed opening portion may be disposed on a side of the fourth-first opening OP4-1*p*1.

The fourth-first opening OP4-1*p*2 may be positioned outside of the first-first opening OP1-1 of the pixel defining layer PDL, and a side of the fourth-first opening OP4-1*p*2 may be divided into a protruding opening portion and a recessed opening portion positioned inside of the optimal opening OP-re of the first organic layer OL1 indicated by a dotted line.

The distance D1-1*p*2 from the optimal opening OP-re of the first organic layer OL1 to the protruding opening portion may be the same as the distance D2-1*p*2 from the optimal opening OP-re of the first organic layer OL1 to the recessed opening portion. For example, the width w1 of the protruding opening portion and the width w2 of the recessed opening portion may be the same as each other on a side of the fourth-first opening OP4-1*p*2.

Figure 24:
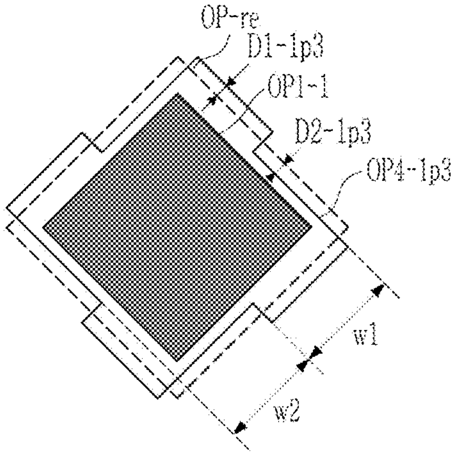

For example, the fourth-first opening OP4-1*p*3 of the embodiment of FIG. 24 is similar to the embodiment of FIG. 23, but the protruding opening portion and the recessed opening portion may be differently disposed from that of FIG. 23. For example, In the embodiment of FIG. 24, the protruding opening portion and the recessed opening portion on a side of the fourth-first opening OP4-1*p*3 may be constant on all sides. In the embodiment of FIG. 23, the protruding opening portion and the recessed opening portion may be equally disposed in each of the four sides of the fourth-first opening OP4-1*p*3.

The distance D1-1*p*3 from the optimal opening OP-re of the first organic layer OL1 to the protruding opening portion may be the same as the distance D2-1*p*3 from the optimal opening OP-re of the first organic layer OL1 to the recessed opening portion. For example, the width w1 of the protruding opening portion and the width w2 of the recessed opening portion may be the same as each other on a side of the fourth-first opening OP4-1*p*3.

Figure 25:
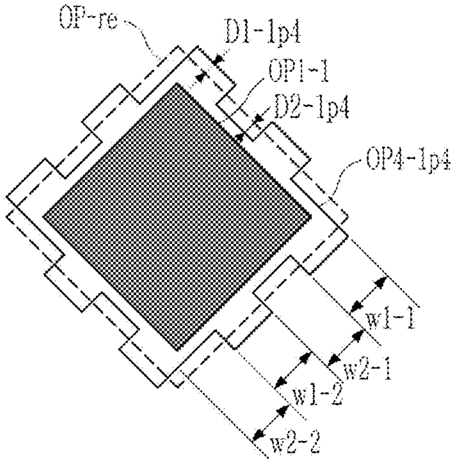
Figure 26:
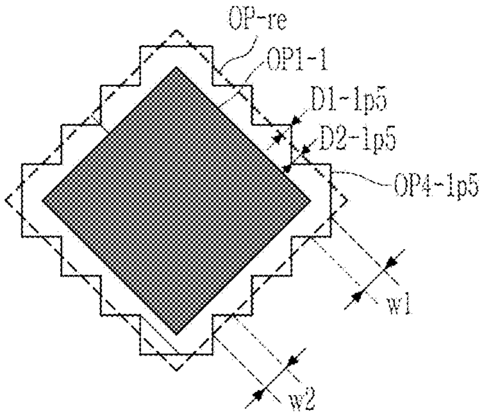

For example, the embodiment of FIG. 25 is an embodiment in which a side has two protruding opening portions and two recessed opening portions.

The fourth-first opening OP4-1*p*4 may be positioned outside of the first-first opening OP1-1 of the pixel defining layer PDL, and a side of the fourth-first opening OP4-1*p*4 may be divided into a protruding opening portion outside of the optimal opening OP-re of the first organic layer OL1 and a recessed opening portion positioned inside of the optimal opening OP-re of the first organic layer OL1 indicated by a dotted line.

The distance D1-1*p*4 from the optimal opening OP-re of the first organic layer OL1 to the protruding opening portion may be the same as the distance D2-1*p*4 from the optimal opening OP-re of the first organic layer OL1 to the recessed opening portion. For example, the sum of the widths w1-1 and w1-2 of two protruding opening portions on a side of the fourth-first opening OP4-1*p*4 and the sum of the widths w2-1 and w2-2 of two recessed opening portions on the side of the fourth-first opening OP4-1*p*4 may be the same as each other. For example, the embodiment of FIG. 26 may be an embodiment with serrated sides unlike FIG. 22 to FIG. 25.

The fourth-first opening OP4-1*p*5 may be positioned outside of the first-first opening OP1-1 of the pixel defining layer PDL, and a side of the fourth-first opening OP4-1*p*5 may be divided into protruding opening portions and recessed opening portions having a sawtooth shape based on the optimal opening OP-re of the first organic layer OL1 indicated by a dotted line.

The distance D1-1*p*5 from the optimal opening OP-re of the first organic layer OL1 to the vertex of the protruding opening portions and the distance D2-1*p*5 from the optimal opening OP-re of the first organic layer OL1 to the vertex of the recessed opening portions may be the same as each other. For example, the width w1 of the protruding opening portion protruded in a sawtooth shape on a side of the fourth-first opening OP4-1*p*5 and the width w2 of the recessed opening portion may be the same as each other.

In the embodiment of FIG. 22 to FIG. 26, although the fourth-first openings OP4-1*p*1, OP4-1*p*2, OP4-1*p*3, OP4-1*p*4, and OP4-1*p*5 are misaligned or enlarged or reduced due to the process error or process dispersion, the protruding opening portions and the recessed opening portions may be modified together based on the optimal opening OP-re, so that half of a side may approach the optimal opening OP-re and the other half may move away from the optimal opening OP-re. As a result, as half of a side approaches the optimal opening OP-re, the front luminance ratio increases. As the other half moves away from the optimal opening OP-re, the front luminance ratio may be low and the half and the other half of the side may compensate for each other. Thus, although the fourth-first openings OP4-1*p*1, OP4-1*p*2, OP4-1*p*3, OP4-1*p*4, and OP4-1*p*5 are misaligned, enlarged or reduced, there is a merit that the front luminance ratio does not change.

FIG. 22 to FIG. 26 show the various embodiments, but embodiments are not limited thereto and may be variously modified. An embodiment may have the following structure.

Referring to FIG. 8, FIG. 9, and FIG. 22 to FIG. 26, it is shown that each side of the fourth-first opening OP4-1*p*1, OP4-1*p*2, OP4-1*p*3, OP4-1*p*4, or OP4-1*p*5 of the first organic layer OL1 is positioned outside of the first-first opening OP1-1 of the pixel defining layer PDL on a plane. However, according to an embodiment, a portion of each side of the fourth-first opening OP4-1*p*1, OP4-1*p*2, OP4-1*p*3, OP4-1*p*4, or OP4-1*p*5 of the first organic layer OL1 may overlap the first-first opening OP1-1 of the pixel defining layer PDL. For example, a part of the first-first opening OP1-1 of the pixel defining layer PDL on a plane may be positioned outside of the fourth-first opening OP4-1*p*1, OP4-1*p*2, OP4-1*p*3, OP4-1*p*4, or OP4-1*p*5 of the first organic layer OL1. For example, the horizontal distance between a side of the fourth-first opening OP4-1*p*1, OP4-1*p*2, OP4-1*p*3, OP4-1*p*4, or OP4-1*p*5 of the first organic layer OL1 positioned inside and the first-first opening OP1-1 of the pixel defining layer PDL positioned outside may be within about 0.5 μm. For example, the fourth-first opening OP4-1*p*1, OP4-1*p*2, OP4-1*p*3, OP4-1*p*4, or OP4-1*p*5 of the first organic layer OL1 may be positioned wider than the first-first opening OP1-1 of the pixel defining layer PDL, so that it is appropriate that light from the emission layer EML through the first-first opening OP1-1 of the pixel defining layer PDL is emitted as a whole to the front. However, in case that the overlapping portion is less than about 0.5 μm, the front luminance ratio may not substantially decrease, so it means that some of the first-first opening OP1-1 of the pixel defining layer PDL may be positioned outside of the fourth-first opening OP4-1*p*1, OP4-1*p*2, OP4-1*p*3, OP4-1*p*4, or OP4-1*p*5 of the first organic layer OL1. For example, the horizontal distance of about 0.5 μm may be a distance measured in the vertical direction to a side of the first-first opening OP1-1 of the pixel defining layer PDL.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
- a substrate;
- a transistor disposed on the substrate;
- a first electrode electrically connected to the transistor;
- a pixel defining layer disposed on the first electrode and including a pixel opening overlapping the first electrode;
- an emission layer overlapping the first electrode and disposed in the pixel opening;
- a second electrode disposed on the pixel defining layer and the emission layer;
- an encapsulation layer disposed on the second electrode;
- a first organic layer disposed on the encapsulation layer and including a rotation opening; and
- a second organic layer disposed inside of the rotation opening and on the first organic layer, wherein;
- the rotation opening has a planar shape formed by increasing a planar shape of the pixel opening by a ratio and rotating the planar shape of the pixel opening by an angle in a direction, and
- the rotation opening includes:
  - a first rotation opening formed by rotating the planar shape of the pixel opening by the angle in a counterclockwise direction, and
  - a second rotation opening formed by rotating the planar shape of the pixel opening by the angle in a clockwise direction.

2. The display device of claim 1, wherein
- a virtual opening is defined as a reference opening maximizing a front luminance ratio of the display device, and
- the virtual opening is defined by increasing the planar shape of the pixel opening by the ratio.

3. The display device of claim 1, wherein
- a virtual opening is defined by increasing the planar shape of the pixel opening by the ratio, and
- a horizontal distance on a plane between the virtual opening and the pixel opening is greater than about 0 μm and less than or equal to about 2.0 μm.

4. The display device of claim 1, wherein a refractive index of the second organic layer is greater than a refractive index of the first organic layer.

5. The display device of claim 1, wherein the first rotation opening and the second rotation opening are alternately disposed.

6. The display device of claim 5, wherein each of the first rotation opening and the second rotation opening is disposed to overlap a pixel opening corresponding to a red emission layer, a pixel opening corresponding to a green emission layer, and a pixel opening corresponding to a blue emission layer.

7. The display device of claim 4, wherein the angle, which is formed by an extension line of a side of the pixel opening and a side of the rotation opening, is about 1.5 degrees or more and about 6 degrees or less.

8. A display device comprising:
a substrate;
a transistor disposed on the substrate;
a first electrode electrically connected to the transistor;
a pixel defining layer disposed on the first electrode and including a pixel opening overlapping the first electrode;
an emission layer overlapping the first electrode and disposed in the pixel opening;
a second electrode disposed on the pixel defining layer and the emission layer;
an encapsulation layer disposed on the second electrode;
a first organic layer disposed on the encapsulation layer and including a rotation opening; and
a second organic layer disposed inside of the rotation opening and on the first organic layer, wherein:
the rotation opening has a planar shape formed by increasing a planar shape of the pixel opening by a ratio and rotating the planar shape of the pixel opening by an angle in a direction,
a refractive index of the second organic layer is greater than a refractive index of the first organic layer,
the angle, which is formed by an extension line of a side of the pixel opening and a side of the rotation opening, is about 1.5 degrees or more and about 6 degrees or less,
a virtual opening is defined by increasing the planar shape of the pixel opening by the ratio,
a portion of the rotation opening disposed outside of the virtual opening has a triangle shape, and
a length of a shortest side of the triangle shape is greater than about 0 μm and less than about 1.5 μm.

9. The display device of claim 1, wherein
a difference between a minimum value and a maximum value among horizontal distances between a side of the pixel opening and a side of the rotation opening adjacent on a plane is greater than about 0 μm and less than or equal to about 3 μm, and
the horizontal distances between the side of the pixel opening and the side of the rotation opening adjacent on a plane are distances in a direction perpendicular to the side of the pixel opening.

10. A display device comprising:
a substrate;
a transistor disposed on the substrate;
a first electrode electrically connected to the transistor;
a pixel defining layer disposed on the first electrode and including a pixel opening overlapping the first electrode;
an emission layer overlapping the first electrode and disposed in the pixel opening;
a second electrode disposed on the pixel defining layer and the emission layer;
an encapsulation layer disposed on the second electrode;
a first organic layer disposed on the encapsulation layer and including an opening including a protruding opening portion and a recessed opening portion; and
a second organic layer disposed inside of the opening of the first organic layer.

11. The display device of claim 10, wherein a refractive index of the second organic layer is greater than a refractive index of the first organic layer.

12. The display device of claim 10, wherein
the protruding opening portion is disposed outside of a virtual opening,
the recessed opening portion is disposed inside of the virtual opening, and
the virtual opening is defined as a reference opening maximizing a front luminance ratio of the display device.

13. The display device of claim 10, wherein
the opening of the first organic layer includes a plurality of openings,
the pixel opening of the pixel defining layer includes a plurality of pixel openings,
at least two protruding opening portions of the plurality of openings of the first organic layer are respectively spaced apart from sides of the plurality of pixel openings by a same distance on a plane, and
at least two recessed opening portions of the plurality of openings of the first organic layer are respectively spaced apart from the sides of the plurality of pixel openings by a same distance on a plane.

14. The display device of claim 13, wherein
at least two of step differences formed by the at least two protruding opening portions and the at least two recessed opening portions in the opening of the first organic layer have a same value.

15. The display device of claim 13, wherein
a step difference between the at least two protruding opening portions and the at least two recessed opening portions on each side of the opening of the first organic layer is greater than about 0 μm and less than or equal to about 3 μm.

16. The display device of claim 10, wherein
the opening of the first organic layer includes a protruding opening portion and a recessed opening portion, and
a width of the protruding opening portion and a width of the recessed opening portion have a same value in the opening of the first organic layer.

17. The display device of claim 10, wherein
the opening of the first organic layer includes a protruding opening portion and a recessed opening portion, and
the recessed opening portion is disposed on sides of the protruding opening portion on a side of the opening of the first organic layer.

18. The display device of claim 10, wherein
the opening of the first organic layer includes a protruding opening portion and a recessed opening portion, and
the protruding opening portion and the recessed opening portion are formed in a same number on a side of the opening of the first organic layer.

19. The display device of claim 10, wherein
the opening of the first organic layer include a protruding opening portion and a recessed opening portion, and
the protruding opening portion and the recessed opening portion form a sawtooth shape.

* * * * *